US012663482B2

(12) United States Patent
Kapodistrias et al.

(10) Patent No.: US 12,663,482 B2
(45) Date of Patent: Jun. 23, 2026

(54) SYSTEMS AND METHODS FOR MONITORING BATTERIES IN USER DEVICES

(71) Applicant: TITAN ADVANCED ENERGY SOLUTIONS, INC., Salem, MA (US)

(72) Inventors: Georgios Kapodistrias, Reading, MA (US); Shawn D. Murphy, Wenham, MA (US); Colin David Campbell, Groton, MA (US); Vahidreza Alizadeh, Salem, MA (US)

(73) Assignee: TITAN ADVANCED ENERGY SOLUTIONS, INC., Salem, MA (US)

( * ) Notice: Subject to any disclaimer, the term of this patent is extended or adjusted under 35 U.S.C. 154(b) by 134 days.

(21) Appl. No.: 18/402,081

(22) Filed: Jan. 2, 2024

(65) Prior Publication Data

US 2024/0241186 A1 Jul. 18, 2024

Related U.S. Application Data

(60) Provisional application No. 63/437,350, filed on Jan. 5, 2023.

(51) Int. Cl.
G01R 31/392 (2019.01)
G01N 29/04 (2006.01)
(Continued)

(52) U.S. Cl.
CPC ......... G01R 31/392 (2019.01); G01N 29/043 (2013.01); G01N 29/2406 (2013.01);
(Continued)

(58) Field of Classification Search
None
See application file for complete search history.

(56) References Cited

U.S. PATENT DOCUMENTS

| | | | |
|---|---|---|---|
| 10,014,561 B2 | 7/2018 | Sood et al. | |
| 10,673,101 B2 | 6/2020 | Sood et al. | |

(Continued)

OTHER PUBLICATIONS

International Search Report and Written Opinion, mailed May 30, 2024, in International Application No. PCT/US24/10033. (8 pages).

*Primary Examiner* — Jas A Sanghera
(74) *Attorney, Agent, or Firm* — RowanTree Law Group, PLLC; Frederick F. Rosenberger

(57) ABSTRACT

Systems and methods for monitoring batteries in user devices are disclosed. The user devices include mobile phones and laptops, in examples. The system includes a micro-electro-mechanical system (MEMS) ultrasound source, a MEMS ultrasound sensor, a signal drive and acquisition module (SDM), and a processor. The MEMS source and sensor are included within the user device and are disposed against the battery. The SDM configures the MEMS source to transmit an ultrasound pulse into the battery, and the MEMS sensor detects ultrasound reflected by or transmitted through the battery. The SDM collects the detected pulses, and the processor analyzes the detected pulses to determine states of the battery including a state of health, a state of charge and an instantaneous battery thickness measurement. For example, the SDM and the processor can be included within the user device, and/or the SDM and the signal processor can be incorporated into an integrated circuit.

22 Claims, 10 Drawing Sheets

(51) Int. Cl.
| | |
|---|---|
| *G01N 29/24* | (2006.01) |
| *G01N 29/34* | (2006.01) |
| *G01N 29/42* | (2006.01) |
| *G01R 31/387* | (2019.01) |

(52) U.S. Cl.
CPC ....... *G01N 29/2437* (2013.01); *G01N 29/343* (2013.01); *G01N 29/42* (2013.01); *G01R 31/387* (2019.01)

(56) References Cited

U.S. PATENT DOCUMENTS

| | | | |
|---|---|---|---|
| 11,609,210 B2 | 3/2023 | Sood et al. | |
| 11,658,354 B2 | 5/2023 | Murphy et al. | |
| 11,764,413 B2 | 9/2023 | Murphy et al. | |
| 11,860,130 B2 | 1/2024 | Sood et al. | |
| 2016/0197382 A1* | 7/2016 | Sood | B60L 58/21 |
| | | | 73/620 |
| 2018/0120168 A1* | 5/2018 | Hsieh | G01K 11/24 |
| 2018/0129849 A1 | 5/2018 | Strohmann et al. | |
| 2018/0287219 A1 | 10/2018 | Sood et al. | |
| 2019/0072614 A1* | 3/2019 | Steingart | G01N 29/4481 |
| 2020/0264056 A1 | 8/2020 | Okulov et al. | |
| 2022/0113284 A1 | 4/2022 | Sood et al. | |
| 2022/0349948 A1 | 11/2022 | Kowalski et al. | |
| 2022/0397610 A1 | 12/2022 | Appleberry et al. | |
| 2023/0055861 A1 | 2/2023 | Sood et al. | |
| 2024/0192175 A1* | 6/2024 | Saga | G01N 29/2437 |

* cited by examiner

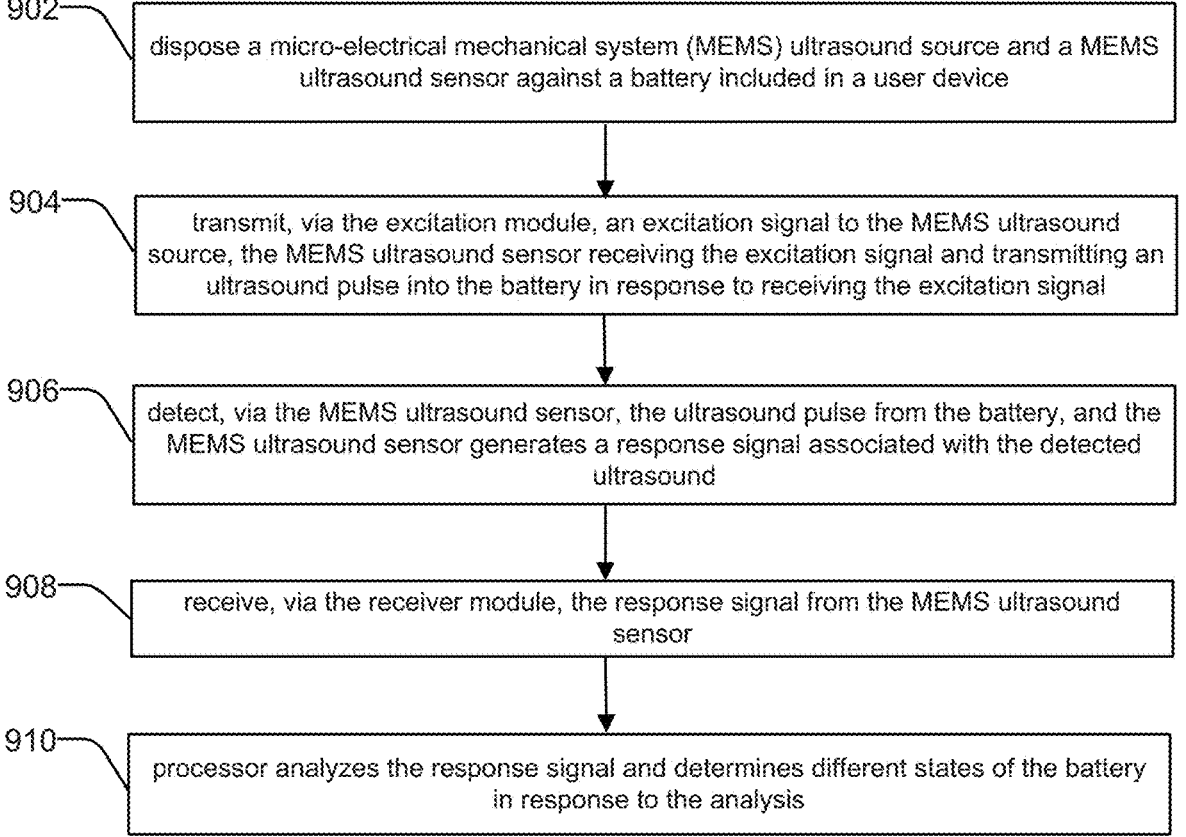

902 — dispose a micro-electrical mechanical system (MEMS) ultrasound source and a MEMS ultrasound sensor against a battery included in a user device 904 — transmit, via the excitation module, an excitation signal to the MEMS ultrasound source, the MEMS ultrasound sensor receiving the excitation signal and transmitting an ultrasound pulse into the battery in response to receiving the excitation signal 906 — detect, via the MEMS ultrasound sensor, the ultrasound pulse from the battery, and the MEMS ultrasound sensor generates a response signal associated with the detected ultrasound 908 — receive, via the receiver module, the response signal from the MEMS ultrasound sensor 910 — processor analyzes the response signal and determines different states of the battery in response to the analysis

Fig. 11

SYSTEMS AND METHODS FOR MONITORING BATTERIES IN USER DEVICES

CROSS-REFERENCE TO RELATED APPLICATION(S)

This application claims benefit of and priority under 35 U.S.C. § 119(c) to and is a non-provisional of U.S. Provisional Application No. 63/437,350, filed Jan. 5, 2023, entitled "Systems and Methods for Monitoring Batteries in User Devices," which is incorporated by reference herein in its entirety.

FIELD

The present disclosure relates generally to non-invasive monitoring of energy storage devices installed in user devices, and more particularly, to monitoring of electrolyte-based batteries (e.g., lithium-ion batteries) installed or installable in user devices, such as but not limited to computer laptops, smart phones, and tablets.

BACKGROUND

User devices are increasingly being equipped with powerful electrolyte-based rechargeable batteries such as lithium-ion batteries. These batteries are long-lasting and can withstand multiple hundreds of charge and discharge cycles. However, the batteries are also typically installed by manufacturers of the user devices and are not accessible to the user.

User devices that include rechargeable batteries have limited ability to monitor and detect problems with the batteries, and to take actions in response to detecting issues. In general, for this purpose, existing battery monitoring systems included within or in communication with user devices rely on periodic voltage and/or current measurements of the batteries. While the existing monitoring systems might be able to determine and alert users as to whether battery capacity has reduced below a recommended operational threshold level (e.g., 80% of original capacity), the systems typically cannot detect battery failure, nor provide early warning of failure.

Moreover, even though increased temperature of batteries can be an early indicator of battery failure, most user devices include a temperature sensor on its Central Processing Unit (CPU) and/or hard drive and not on the batteries. While the user devices might send a warning message to the user when the temperature of the user device exceeds a threshold value, the user must act by shutting down the system, and the user receives no indication that a failing battery might be the cause of the temperature increase. This can be especially dangerous, because once rechargeable batteries begin to fail, they can quickly degrade in a matter of minutes (e.g., 10 to 15 minutes) to a catastrophic failure state. In this catastrophic failure state, the electrolyte of the batteries might breach the housing or protective packaging of the battery, causing fire and other damage within the user device.

Embodiments of the disclosed subject matter may address one or more of the above-noted problems and disadvantages, among other things.

SUMMARY

Embodiments of the disclosed subject matter provide systems, methods, and devices for continuous (or semicontinuous) monitoring of batteries in user devices. Some embodiments can check and predict performance of the batteries, can detect and predict early indicia of battery failure, can alert one or more users as to any performance or failure issues, and/or can provide one or more users with an early indication of failure. In this way, embodiments of the disclosed subject matter can protect users from harm and/or the user devices from damage (or at least catastrophic or irrecoverable damage).

In some embodiments, instantaneous states of a battery under test can be determined by ultrasound interrogation. The battery can be installed in a user device (e.g., mobile or smart phone, laptop, e-reader, computer workstation, game console, tablet computing device, etc.). The states of the battery can be based on ultrasound signals transmitted by the system at one or more spatially separated locations of the battery and then collected by the system. The system analyzes the collected signals to obtain the states of the battery. In some embodiments, at least one micro-electro-mechanical system (MEMS) ultrasound source and at least one MEMS ultrasound sensor can be included within the user device. In some embodiments, one, some, or all of the at least one MEMS ultrasound source and MEMS ultrasound sensor can be disposed against the battery.

In some embodiments, in one operational mode of a system (also known as an "echo mode"), the MEMS ultrasound source and the MEMS ultrasound sensor can be included in a single transducer device that is disposed against a same surface of the battery. The MEMS ultrasound sensor can be configured to transmit an ultrasound pulse into the battery, and the MEMS ultrasound sensor can be configured to detect ultrasound pulses reflected from an interior of the battery. In some embodiments, in another operational mode of the system (also known as "through-transmission mode"), at least one MEMS ultrasound source and at least one MEMS ultrasound sensor can be disposed against opposing surfaces of the battery. Here, the MEMS ultrasound sensor can detect ultrasound pulses transmitted through the battery by the MEMS ultrasound source. Whether the system is configured in echo mode or through-transmission mode, the system can collect the detected ultrasound pulses and can analyze the detected pulses and information extracted, or otherwise calculated, from the pulses to determine the states of the battery.

In some embodiments, a system can include several components, for example, in addition to the MEMS ultrasound source(s) and the MEMS ultrasound sensor(s). Such components can include, but are not limited to, a signal drive and acquisition module (SDM) and a processor (also known as a signal processor). In some embodiments, the SDM can include a controller, a memory, an excitation module, and a receiver module.

In some embodiments, a system can operate as follows. The excitation module can be configured by the controller to transmit an excitation signal to the MEMS ultrasound source(s), and the MEMS ultrasound source(s) can transmit an ultrasound pulse into the battery in response to the excitation signal. The MEMS ultrasound sensor(s) can be configured by the controller to detect the ultrasound pulse from the battery and to generate a response signal associated with the detected ultrasound. The receiver module can receive the generated response signal from the MEMS ultrasound sensor(s). The signal processor can access the receiver module, analyze the response signal, and determine different states of the battery in response to the analysis. The different states of the battery can include, for example, a state of health (SOH), a state of charge (SOC), a temperature, an instantaneous thickness of the battery, and a thickness of the battery determined over time (e.g., lifetime thickness).

In some embodiments, a system (or one or more components thereof) can be incorporated into the user device, for example, at time of manufacture of the user device and/or at time of manufacture of the batteries. In some embodiments, the SDM and the signal processor, along with the MEMS ultrasound source(s) and MEMS ultrasound sensor(s), can be included within the user device. For example, the SDM and the signal processor can be incorporated into a same integrated circuit, such as an Application Specific Integrated Circuit (ASIC) or combinations of discrete electronic components.

In some embodiments, the system can include a battery management system (BMS). Alternatively, the system can be in communication with a BMS. In some embodiments, when the system identifies or predicts performance and/or failure of the batteries, the system can be configured to send alert messages to the BMS. In some embodiments, in response to receiving the messages, the BMS can be configured to send one or more signals to the user device or components thereof, for example, to shut power to the user device and/or disable charging of the batteries as a safety precaution.

In one or more embodiments, a system can monitor a battery within a user device. For this purpose, the system can include a MEMS ultrasound source and a MEMS ultrasound sensor, an SDM and a processor. The MEMS ultrasound source and sensor can each be included within the user device and can be disposed against the battery. The SDM can include a controller, a memory, an excitation module, and a receiver module.

In some embodiments, the excitation module can be configured (e.g., by the controller) to transmit an excitation signal to the MEMS ultrasound source. In response to the excitation signal, the MEMS ultrasound source can be configured to transmit an ultrasound pulse into the battery. The MEMS ultrasound sensor can be configured (e.g., by the controller) to detect the ultrasound pulse from the battery and to generate a response signal associated with the detected ultrasound, which response signal can be received by the receiver module. The processor can be configured to access the receiver module, analyze the response signal, and determine different states of the battery in response to the analysis.

In some embodiments, the MEMS ultrasound source and the MEMS ultrasound sensor can be disposed against a same surface of the battery, and the MEMS ultrasound sensor detects ultrasound pulses reflected from an interior of the battery. Alternatively or additionally, in some embodiments, the MEMS ultrasound source can be disposed against a first surface of the battery, the MEMS ultrasound sensor can be disposed against a second surface of the battery that opposes the first surface, and the MEMS ultrasound sensor detects ultrasound transmitted through the battery. In some embodiments, one or both of the MEMS ultrasound source and the MEMS ultrasound sensor can be a capacitive micromachined ultrasonic transducer (CMUT) or a piezoelectric micromachined ultrasonic transducers (PMUT).

In some embodiments, the SDM and the processor can be included within the user device. For example, the SDM and the processor can be incorporated into a same integrated circuit.

In some embodiments, the states determined by the system can include a state of charge (SOC), a state of health (SOH), and a temperature of the battery. In some embodiments, the states can also include, but are not limited to, an instantaneous thickness measurement of the battery, and a lifetime thickness measurement of the battery. For example, the lifetime thickness measurement can be determined from one or more instantaneous thickness measurements of the battery obtained over time and stored in memory. In some embodiments, the states might be determined when the battery is discharged or when fully charged. Alternatively or additionally, in some embodiments, the states might be determined while the battery is charging or discharging.

In some embodiments, a memory can include a set of feature rules, for example, that define one or more features for the processor to extract from the response signal during the analysis of the response signal.

In one or more embodiments, a method for monitoring a battery within a user device can comprise transmitting an excitation signal to a MEMS ultrasound source such that the MEMS ultrasound source transmits an ultrasound pulse into the battery in response to the excitation signal. The method can further comprise detecting, via the MEMS ultrasound sensor, the ultrasound pulse from the battery and generating a response signal associated with the detected ultrasound. The method can also comprise receiving the response signal from the MEMS ultrasound sensor and analyzing the response signal. The method can further comprise determining different states of the battery in response to the analyzing. In some embodiments, the method can also comprise disposing the MEMS ultrasound source and the MEMS ultrasound against the battery, wherein the battery is included in the user device.

Any of the various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

BRIEF DESCRIPTION OF THE DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

FIG. 11 is a flowchart that describes a method of operation of an in-situ battery assessment and monitoring system installed in a user device, according to one or more embodiments of the disclosed subject matter.

DETAILED DESCRIPTION

General Considerations

Figure 1:
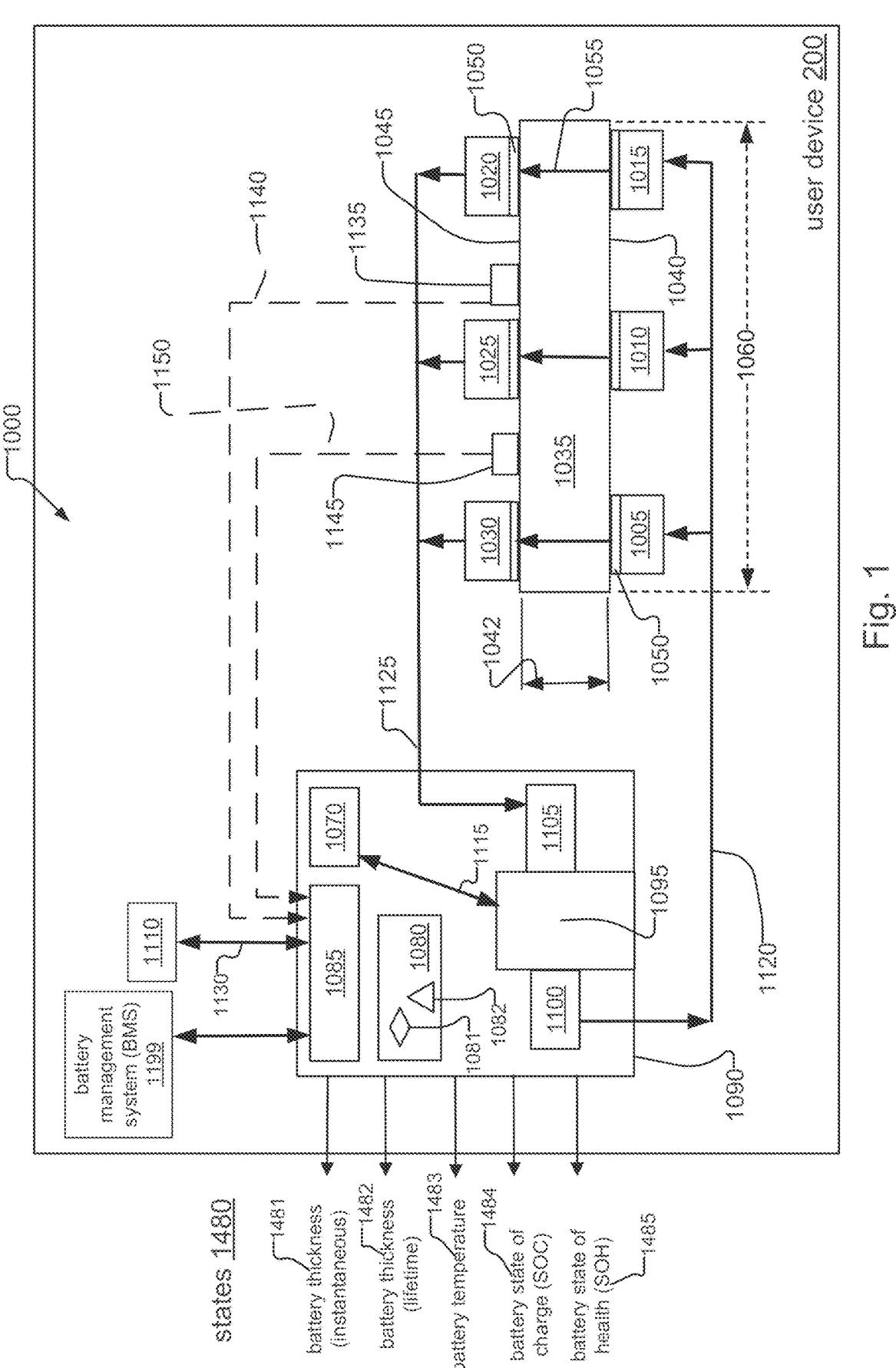
FIG. 1 is a schematic representation of an in-situ battery assessment and monitoring system, according to one or more embodiments of the disclosed subject matter, where the system is configured to assess one or more states of a battery included within a user device using MEMS ultrasound sources and sensors operating in a through-transmission mode, and where the system in its entirety is included within the user device.

For purposes of this description, certain aspects, advantages, and novel features of the embodiments of this disclosure are described herein. The disclosed methods and systems should not be construed as being limiting in any way. Instead, the present disclosure is directed toward all novel and nonobvious features and aspects of the various disclosed embodiments, alone and in various combinations and sub-combinations with one another. The methods and systems are not limited to any specific aspect or feature or combination thereof, nor do the disclosed embodiments require that any one or more specific advantages be present, or problems be solved. The technologies from any embodiment or example can be combined with the technologies described in any one or more of the other embodiments or examples. In view of the many possible embodiments to which the principles of the disclosed technology may be applied, it should be recognized that the illustrated embodiments are exemplary only and should not be taken as limiting the scope of the disclosed technology.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one skilled in the art.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person skilled in the art to have a more definitive construction, the numerical parameters set forth are approximations that may depend on the desired properties sought and/or limits of detection under standard test conditions/methods, as known to those skilled in the art. When directly and explicitly distinguishing embodiments from discussed prior art, the embodiment numbers are not approximates unless the word "about," "substantially," or "approximately" is recited. Whenever "substantially," "approximately," "about," or similar language is explicitly used in combination with a specific value, variations up to and including 10% of that value are intended, unless explicitly stated otherwise.

Directions and other relative references may be used to facilitate discussion of the drawings and principles herein but are not intended to be limiting. For example, certain terms may be used such as "inner," "outer,", "upper," "lower," "top," "bottom," "interior," "exterior," "left," right," "front," "back," "rear," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" part can become a "lower" part simply by turning the object over. Nevertheless, it is still the same part, and the object remains the same.

As used herein, "comprising" means "including," and the singular forms "a" or "an" or "the" include plural references unless the context clearly dictates otherwise. The term "or" refers to a single element of stated alternative elements or a combination of two or more elements unless the context clearly indicates otherwise. As used herein, the term "and/or" includes any and all combinations of one or more of the associated listed items. It will be further understood that the terms "includes," "comprises," "has," "including," "having," and/or "comprising," when used in this specification, specify the presence of stated features, integers, steps, operations, elements, and/or components, but do not preclude the presence of addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present, unless explicitly stated otherwise.

Although there are alternatives for various components, parameters, operating conditions, etc. set forth herein, that does not mean that those alternatives are necessarily equivalent and/or perform equally well. Nor does it mean that the alternatives are listed in a preferred order, unless stated otherwise. Unless stated otherwise, any of the groups defined below can be substituted or unsubstituted.

Unless explained otherwise, all technical and scientific terms used herein have the same meaning as commonly understood to one skilled in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Features of the presently disclosed subject matter will be apparent from the following detailed description and the appended claims.

Overview of Terms

The following is provided to facilitate the description of various aspects of the disclosed subject matter and to guide those skilled in the art in the practice of the disclosed subject matter.

| TERM | DEFINITION |
|---|---|
| FFT | Fast Fourier Transform |
| IFFT | Inverse Fast Fourier Transform |
| PMUT | Piezoelectric Micro-Machined Ultrasound Transducer |
| CMUT | Capacitive Micro-Machined Ultrasound Transducer |
| MEMS | Micro-Electro-Mechanical System |
| ASIC | Application Specific Integrated Circuit |

REFERENCE NUMBER LIST

The reference numbers below are used throughout this description and the accompanying drawings, unless specifically indicated otherwise:

| REF. No. | DESCRIPTION | REF. No. | DESCRIPTION |
|---|---|---|---|
| 200 | User Device | 1146 | Current Sensor |
| 531 | Computing Environment | 533 | Software |
| 535 | Central Processing Unit | 537 | Graphic or Co-Processing Unit |
| 539 | Memory | | |
| 551 | Basic Configuration of Computing Environment | 541 | Memory |
| | | 561 | Storage |
| 571 | Input Device(s) | 581 | Output Device(s) |
| 591 | Communications Connection(s) | 1147 | voltage sensor |
| | | 1199 | battery management system (BMS) |
| 1000 | battery monitoring system | | |
| 1005 | MEMS ultrasound source | 1200 | battery monitoring system |
| 1010 | MEMS ultrasound source | 1255 | signal channel |
| 1015 | MEMS ultrasound source | 1270 | MEMS transducer |
| 1020 | MEMS ultrasound sensor | 1300 | battery monitoring system |
| 1025 | MEMS ultrasound sensor | 1400 | battery monitoring system |
| 1030 | MEMS ultrasound sensor | 1401 | pulser |
| 1035 | battery | 1402 | transmit/receive (T/R) switch |
| 1040 | first surface (of battery) | | |
| 1042 | thickness dimension (of battery) | 1403 | linear amplifier |
| | | 1404 | analog to digital (A/D) converter |
| 1045 | second surface (of battery) | | |
| 1050 | couplant | 1406 | first sequence controller |
| 1055 | transmission axis | 1407 | second sequence controller |
| 1070 | controller | 1408 | third sequence controller |
| 1080 | memory module | 1480 | states (of the battery) |
| 1081 | feature rules | 1481 | instantaneous thickness measurement [state] |
| 1082 | action rules | | |
| 1085 | communications interface | 1482 | lifetime thickness measurement [state] |
| 1086 | (digitized) response signal | | |
| 1087 | (digitized) temperature signal | 1483 | battery temperature [state] |
| 1088 | (digitized) current signal | 1484 | state of charge (SOC) |
| 1089 | (digitized) voltage signal | 1485 | state of health (SOH) |
| 1090 | signal drive and acquisition module (SDM) | 1500 | battery monitoring system |
| | | 1600 | battery monitoring system |
| 1095 | controller interface | 1602 | origin (of a battery surface) |
| 1097 | pulse shaping instructions | 1710 | semiconductor wafer |
| 1100 | excitation module | 1720 | array |
| 1105 | receiver module | 1802 | element (of MEMS transducer) |
| 1110 | signal processor | | |

-continued

| REF. No. | DESCRIPTION | REF. No. | DESCRIPTION |
|---|---|---|---|
| 1115 | communications channel | 1902 | non-conductive substrate |
| 1120 | power channel | 1904 | bottom layer |
| 1125 | signal channel | 1906 | vacuum well |
| 1130 | communications channel | 1908 | insulator layer |
| 1140 | temperature signal channel | 1910 | first electrode layer |
| 1145 | power sensor | 1912 | piezoelectric layer |
| | | 1914 | second electrode layer |
| | | 1920 | AC voltage |

Introduction

Embodiments of the disclosed subject matter will now be described more fully hereinafter with reference to the accompanying drawings, in which illustrative embodiments are shown.

Lithium-ion batteries typically include one or more battery cells immersed in an electrolyte. The battery cells can be arranged in layers within the battery. For example, in a prismatic battery, the layers are arranged horizontally along a length of the battery. Each cell includes the following layers/components: a cathode electrode (cathode), a separator, and an anode cathode (anode). The separator is formed from an electrically insulating material. An additional cell separator is added between each adjacent battery cell.

Ultrasound "Through-Transmission" Mode

FIG. 1 is a schematic representation of a battery monitoring system 1000 configured for ultrasound interrogation of a test battery 1035 using a through-transmission method. The battery 1035 is installed in a user device 200, and the entirety of the system 1000 is included in the user device 200. The system 1000 might also include a battery management system (BMS) 1199. In the illustrated example, the battery 1035 is a rectangular element having a first surface 1040 and an opposing second surface 1045 separated by a thickness dimension 1042. The surfaces 1040, 1045 are substantially flat and parallel to one another and extend along a length 1060 of the battery 1035. The thickness dimension 1042 is substantially perpendicular to the length 1060. Other battery shapes and configurations can be interrogated by through transmission ultrasound without deviating from the concepts of the present disclosure.

The system 1000 includes various components. These components include one or more MEMS ultrasound sources and one or more MEMS ultrasound sensors. Three MEMS ultrasound sources 1005, 1010, 1015 and three MEMS ultrasound sensors 1030, 1025 and 1020 are shown. However, any number of sources and/or sensors is also possible according to one or more contemplated embodiments. The system 1000 also includes a signal drive and acquisition module (SDM) 1090, a signal processor 1110, a power sensor 1145 and a temperature sensor 1135.

The SDM 1090 includes a controller 1070, a memory module 1080 and a communications interface 1085, an excitation module 1100, an ultrasound receiver module 1105 and a controller interface 1095. The memory module 1080 is interfaced with the controller 1070, the communications interface 1085 and the controller interface 1095. The memory module 1080 includes various rules and instructions for the signal processor 1110 to load and execute, such as a set of feature rules 1081 and a set of action rules 1082. In examples, the controller 1070 may be a processor or a microcontroller. The controller 1070 may further comprise a plurality of digital data processors and memories interfaced therewith.

The components of the system 1000 are arranged as follows. Each MEMS ultrasound source 1005, 1010, 1015 is disposed against the first surface 1040 of the battery 1035 and is configured by the SDM 1090 to emit ultrasound toward and through the first surface 1040. Each ultrasound sensor 1020, 1025, 1030 is disposed against the second surface 1045 and is configured by the SDM 1090 to sense/detect ultrasound exiting from the battery 1035 through the second surface 1045. In the illustrated example, both the power sensor 1145 and the temperature sensor 1135 are disposed against the second surface 1045 of the battery 1035.

In some embodiments, the MEMS ultrasound sources and the MEMS ultrasound sensors are acoustically coupled to a corresponding surface of the battery 1035 by a couplant material 1050. The couplant 1050 is disposed between a surface of the battery and a surface of a corresponding ultrasound source or sensor. In the illustrated example, a separate instance of couplant 1050 is located between each MEMS ultrasound source 1005, 1010, 1015 and the first surface 1040 of the battery 1035. Alternatively or additionally, in some embodiments, a separate instance of couplant 1050 is located between each MEMS ultrasound sensor 1030, 1025, 1020 and the second surface 1045 of the battery 1035. The couplant material is selected to reduce acoustic resistance, for example, by eliminating air between corresponding surfaces of the battery and surfaces of the ultrasound sources and sensors. Acoustic couplant material may comprise liquids, gels, or solid materials. In examples, the couplant might be attached to the battery 1035 via an adhesive or bonded directly onto the battery, for example, to ensure permanent placement thereon.

The MEMS ultrasound sources and sensors may be capacitive micro-machined ultrasound transducers (CMUTs) or piezoelectric micro-machined ultrasound transducers (PMUT). In some embodiments, all of the MEMS ultrasound sources and sensors are either CMUTs or PMUTs. Both types of MEMS devices are typically silicon-based and fabricated using established integrated circuit batch-production processes commonly used in the semiconductor industry. The resulting MEMS device is small and thin (e.g., ≤0.5 mm thick) while volume manufacturing allows for a very low-cost device.

In some embodiments, each ultrasound source is paired with a corresponding ultrasound sensor, for example, when the MEMS ultrasound source 1005 is paired with the MEMS ultrasound sensor 1030 along a common transmission axis 1055. In the illustrated example, three MEMS ultrasound sources 1005, 1010, 1015 are each respectively paired with a different MEMS ultrasound sensor 1030, 1025, 1020, such that each paired ultrasound source and ultrasound sensor is disposed to interrogate a different region of the interior of the battery 1035. Through-transmission method configurations may include one or more ultrasound sources disposed to direct ultrasound into a battery along a transmission axis 1055. The ultrasound source may be disposed to direct the ultrasound through any surface of the battery and to an ultrasound sensor, paired therewith, and is disposed to receive the ultrasound exiting from the battery through any other surface of the battery when the ultrasound sensor and the ultrasound source are coaxially aligned along the transmission axis 1055. Thus, ultrasound interrogation of a battery 1035 by a through-transmission method relates to detecting ultrasound received along the transmission axis 1055 after one pass through the thickness of the battery, e.g., the dimension 1042 shown in FIG. 1.

In the case of a prismatic battery, as shown in FIG. 1, the ultrasound axis 1055 is substantially perpendicular to the surfaces 1040, 1045 of the battery 1035. Because the battery cells within the battery 1035 are "stacked" on top of one another along its length 1060, a plane of the battery cells is also substantially perpendicular to the ultrasound axis 1055. Thus, the thickness 1042 of the battery 1035 is at least a sum of the thicknesses of its individual battery cells.

The signal processor 1110 communicates with the SDM 1090 over a communications channel 1130. The communications channel 1130 is established between the signal processor 1110 and the communications interface 1085 of the SDM 1090. The controller 1070 communicates with the excitation module 1100 and the receiver module 1105 via an internal communications channel 1115 established between the controller 1070 and the controller interface 1095.

The excitation module 1100 connects to the MEMS ultrasound sources 1005, 1010, and 1015 via a power channel 1120. The power channel 1120 supports a communications protocol that enables the excitation module 1100 to send excitation signals to one or more MEMS ultrasound sources at a time. The receiver module 1105 connects to the MEMS ultrasound sensors 1030, 1025 and 1020 via a signal channel 1125. The signal channel 1125 also supports a communications protocol that enables the receiver module 1105 to receive response signals from one or more MEMS ultrasound sensors at a time. In some embodiments, the communications protocol can also support metadata, for example, so that the response signals can identify which of the one or more MEMS ultrasound sensors sent the response signals.

The power sensor 1145 connects to the communications interface 1085 via a power signal channel 1150, and the temperature sensor 1135 (e.g., a thermistor) connects to the communications interface via a temperature signal channel 1140.

The BMS 1199 communicates with other components of the system 1000 via the communications interface 1085. In the illustrated example, the BMS 1199 is included within the user device 200 and receives voltage, temperature, and current measurements from the temperature sensor 1135 and the power sensor 1145 via the communications interface 1085. The BMS 1199 might also receive other signals sent from the controller 1070 and/or signal processor 1110, such as a shutdown signal and a signal to activate a cooling fan within the user device 200, in examples. Additionally or alternatively, the BMS 1199 might be located outside of/external to the user device 200 and receive the timestamped temperature, current, and voltage measurements of each battery 1035 or other signal information via the communications interface 1085 or other interface, connector, or the like.

The system 1000 optionally includes additional sensors disposed to measure one or more characteristics of the battery, for example, electrical power storage characteristics, mechanical deformation characteristics, internal pressure characteristics, or other instantaneous physical, electrical, or optical characteristics of the battery 1035 while the battery is being interrogated by ultrasound (or before, after, or between ultrasound interrogations). The various signal communication channels can be configured as wired communication channels, as wireless communication channels, as digital or analog communication channels, or as optical communication channels, in examples.

In some embodiments, the system 1000 can operate as follows. At system startup, the signal processor 1110 loads various information stored in the memory module 1080 for configuration and operation of the system 1000. This information includes operating modes of the SDM 1090, processing instructions and algorithms, and the set of feature rules 1081 and the set of action rules 1082, in examples. The excitation module 1100 and the receiver module 1105 are operated according to the one or more operating modes stored in the memory module 1080 and executed by the controller 1070.

In through-transmission operating mode, as shown, the SDM 1090 is configured by the controller 1070 to generate and deliver an electrical excitation signal to each MEMS ultrasound source over the power channel 1120. In more detail, each MEMS ultrasound source 1005, 1010, and 1015 is configured to generate ultrasound in response to an electrical excitation signal received thereby from the excitation module 1100 over the power channel 1120. The generated ultrasound emitted from each ultrasound source is directed toward and through the battery along a transmission axis 1055 corresponding therewith. The transmission axis 1055 in the present example is perpendicular to each of the first and second surfaces 1040 and 1045.

Each MEMS ultrasound sensor 1030, 1025, and 1020, in turn, is configured to sense ultrasound passing through the second surface 1045 along the transmission axis 1055, and to generate a response signal corresponding with the sensed ultrasound. The response signal corresponding with each ultrasound sensor is transmitted to the receiver module 1105 over the signal channel 1125. The response signal corresponding with each MEMS ultrasound sensor can be represented by an A-scan comprising sensed ultrasound amplitude versus a time of flight, wherein the time of flight is a measure of a time interval between ultrasound being emitted from an ultrasound source and ultrasound being sensed by an ultrasound sensor.

The generated ultrasound emitted from each ultrasound source produces longitudinal wave oscillations that propagate through the battery along the transmission axis 1055 corresponding therewith. The longitudinal wave oscillations propagate energy and waveforms into the battery along the transmission axes. A portion of the energy and waveforms exit from the battery 1035 when the energy and waveforms pass through an external surface of the battery 1035. In some embodiments, with the system 1000 configured in through-transmission mode, each MEMS ultrasound source is positioned, opposed to, and/or paired with, an associated MEMS ultrasound sensor.

Ultrasound waveform frequencies used for non-destructive testing by the system 1000 can range between 20 kHz and 15 MHz, with the selection of the ultrasound interrogation frequency for each test device depending on the materials and dimensions of the battery 1035. Lower frequency ultrasound penetrates deeper into a battery than higher frequency ultrasound. Thus, low frequency ultrasound may be desirable for interrogating batteries having a longer transmission axis 1055. Higher frequency ultrasound provides greater resolution, which enables detection of smaller defects, or enables detection of more information about characteristics of the interior of the battery. However, higher frequency ultrasound typically carries less energy, and once transmitted into the battery 1035, the ultrasound signal attenuates faster as compared to lower frequency ultrasound signals. One manifestation of this is a lower signal amplitude.

Ultrasound waveform characteristics generated by an ultrasound source depend on characteristics of the electrical excitation signal, characteristics of the ultrasound emitter and environmental characteristics (e.g., temperature). The ultrasound waveform can be tailored to the test device/battery 1035. For example, in some embodiments, the frequency of the ultrasound wave is selected to excite/interrogate the battery at its resonant frequency. When the battery 1035 is excited at its resonant frequency, ultrasound input energy efficiently propagates through, is absorbed and re-emitted by structures within the battery to the ultrasound sensor. The ultrasound sensor therefore receives re-emitted ultrasound energy with typically higher ultrasound energy amplitude than would be received if the ultrasound frequency was not matched with a resonant frequency of the battery.

The battery 1035 may have multiple resonant frequencies. Accordingly, there are a plurality of ultrasound frequencies that can be selected to resonate the battery to absorb ultrasound energy and re-emit the ultrasound energy for detection by the ultrasound sensor. In non-limiting exemplary embodiments, the wavelength of the ultrasound wave is less than the battery thickness dimension 1042. Additionally, a near field boundary separating a Fresnel region and the Fraunhofer region of the ultrasound wave occurs inside the battery 1035.

It is also important to note that using ultrasound to excite batteries 1035 at their resonant frequency is not an absolute requirement. While exciting materials (such as batteries) at their resonant frequency improves the efficiency of the re-radiation of sound, exciting batteries at their resonant frequency is not a limiting condition for material interrogation with ultrasound. In one example, ultrasound transducers placed at specific locations of a battery (such as near its edges) might not be configured to transmit ultrasound at frequencies that are at or near a resonant frequency of the battery. This is because at these locations, the behavior of ultrasound having a frequency that is at or near a resonant frequency of the battery, at least in the frequency domain, might not be representative of the battery as a whole. As a result, echo mode or through-transmission mode ultrasound pulses directed at these locations might be transmitted at frequencies other than a resonant frequency of the battery and may be partially or fully damped in an effort to become close to a noise floor.

Differences in characteristics of ultrasound transmitted into the battery 1035 by each MEMS ultrasound source and characteristics of ultrasound sensed by each ultrasound sensor are evaluated by the signal processor 1110. The signal processor 1110 can use the differences in characteristics to determine a state of the battery 1035 as a whole and/or to determine variations of a state of the battery at different regions of the interior of the battery 1035, in examples.

The SDM 1090 and the controller 1070 then receive the response signals from each of the MEMS ultrasound sensors 1030, 1025, 1020 over the signal channel 1125. Each response signal is responsive to ultrasound sensed by at least one ultrasound sensor, where the sensed ultrasound was delivered into the battery 1035 by at least one ultrasound source.

The signal processor 1110 is configured to analyze response signals received by the receiver module 1105, in conjunction with temperature signals received at the communications interface 1085 from the temperature sensor 1135 and current and voltage signals received from the power sensor 1145.

The signal processor 1110 analyzes the response signals in a manner that characterizes the battery 1035 into different states, for example, to identify defects, to characterize homogeneity, to monitor physical, electrical, or composition changes in the battery, or the like. Analysis of the response signals by the signal processor 1110 may comprise analyzing the response signals in different domains, for example, a time domain, a frequency domain, a spatial domain, or the like. Analysis of the response signals by the signal processor 1110 may further comprise identifying features of the response signals and comparing the identified features of the response data with feature templates stored within the memory module 1080 to determine characteristics of the battery 1035 based on feature matching.

In some embodiments, during operation of the system 1000, the SDM 1090 can be configured to operate in a "round robin" fashion when sending signals to and receiving signals from the MEMS ultrasound sources and sensors, respectively. The power channel 1120 might support a communications protocol that enables the excitation module 1100 to address the MEMS ultrasound sources, and the signal channel 1125 might support a communications protocol that enables communications between the MEMS ultrasound sensors and the receiver module 1105. For example, the excitation module 1100 can be instructed by the controller 1070 to send an excitation signal over the power channel 1120 to a first MEMS ultrasound source. The SDM 1090 waits to receive the response signal from the MEMS ultrasound sensor paired with the first MEMS ultrasound source, before the SDM sends the excitation signal over the power channel 1120 to the next MEMS ultrasound source.

The SDM 1090 stores the response signals from each of the MEMS ultrasound sensors to a buffer. After the SDM 1090 receives the response signals from all the MEMS ultrasound sensors, the SDM 1090 sends a "ready" signal to the signal processor 1110 to access and analyze the response signals in the buffer. In some embodiments, the SDM 1090 can send the ready signal to the signal processor to access and analyze the response signals in the buffer in conjunction with the temperature signal and the current and voltage signals.

The signal processor 1110 determines different states 1480 of the battery 1035 based upon the response signals/in response to the analysis of the response signals, and the SDM 1090 provides the states 1480 as output of the system 1000. These states 1480 can include: an instantaneous thickness measurement of the battery 1481; a lifetime battery thickness measurement 1482; a battery temperature 1483; a battery state of charge (SOC) 1484; and a battery state of health (SOH) 1485. In one example, the lifetime battery thickness measurement 1482 is determined by averaging instantaneous thickness measurements 1481 taken over time and stored to the memory module 1080 over time.

The set of feature rules 1081 define one or more features for the signal processor 1110 to extract from the response signals and to analyze during the analysis of the response signals. The set of action rules 1082 can include logic (e.g., business logic), for example, to determine whether the states 1480 are within safe/normal ranges, as compared to stored states of reference batteries of the same type as the test battery 1035. The signal processor 1110 can also create and send alert messages based upon the analysis of the response signals, such as when the set of action rules 1082 indicate that one or more of the output states 1480, and/or information inferred from the states 1480, individually and/or in combination, are not within safe/normal ranges and thresholds.

In some embodiments, the system 1000 can receive its source of power from the user device 200. In some embodiments, while the system 1000 may have low power consumption, the system 1000 can run only when the battery 1035 of the user device 200 is charging. In some embodiments, the system 1000 can be designed to operate independently from the processing and memory resources of the user device 200.

Via the communications interface 1085, the BMS 1199 can also receive one or more of the output states 1480 from the SDM 1090. In response to receiving one or more of the output states 1480, the BMS 1199 can send signals or messages over the communications interface 1085 to the controller 1070, instructing the controller 1070 to disable and/or cease charging the battery 1035, in one example. Alternatively or additionally, in some embodiments, based upon the states 1480 or information that the signal processor 1110 can determine from the states, the signal processor 1110 can prepare a message predicting a shorter battery life than expected. The signal processor 1110 can send this information to the BMS 1199, and in response, the BMS 1199 can adjust charging parameters (e.g., reduce the current applied to the battery during charging), for example, to prolong battery life.

Using the set of action rules 1082, the signal processor 1110 can also create alert messages based upon the output states 1480. The alert messages can use standard communications protocols (e.g., internet-based protocols, cellular-based messages such as Short Message Service (SMS) and Multimedia Messaging Service (MMS)), or proprietary protocols. In another example, the alert messages may be in the form of pre-coded numbers/message codes associated with specific warnings and failures of different types that can be sent as signals, without the need for communications software and protocol stacks. The BMS 1199 and user devices of operators of the system 1000 can be configured as the recipient/destination address of the alert messages.

Batteries, such as lithium-ion batteries, swell over time for various reasons and have different swelling types. These types include normal reversible swelling, normal irreversible swelling and abnormal irreversible swelling. The system 1400 (and the other embodiments of the system in this disclosure) use ultrasound to detect the different types of battery swelling and then provide the measure or level of swelling as output/states of the battery. These swelling states include the instantaneous thickness measurement 1481 and the lifetime battery thickness measurement 1482, in examples.

For example, new batteries that have never been charged have an initial, substantially uniform thickness, and swell (change their thickness) when charged. During charging, chemical reactions inside the batteries change its density, stiffness and generate heat, causing the batteries to increase in thickness. The chemical reactions occurring during charging can also change a speed of sound of the battery as a derivative property. Once discharged, the batteries substantially return to their initial thickness. This type of battery swelling is known as normal reversible swelling.

Over the lifetime of a battery, materials inside the battery can decompose and accumulate within the battery, which also causes the battery to swell. This type of battery swelling is known as normal irreversible swelling. The materials that decompose include portions of battery terminals and of a Solid Electrolyte Interphase (SEI) layer. The materials accumulate within an electrolyte of the lithium-ion batteries. The net effect of the accumulation of these materials increases the thickness of the battery over time and can reduce the charge capacity of the battery. While this swelling is irreversible, it is normal as a battery ages and/or as the number of charge/discharge cycles increases.

Abnormal swelling of batteries can also occur. The abnormal swelling type occurs when excessive heat and/or gas buildup within the battery. Causes include manufacturing flaws, damage to the battery, or when the number of charge/discharge cycles exceeds a threshold amount, in examples. This abnormal swelling type is an early indicator of catastrophic, irreversible failure of the batteries which can cause material damage to the user devices 200, a release of harmful chemicals, and/or fire. Such abnormal swelling should generally be avoided.

In some embodiments, the set of action rules 1082 can also define absolute and relative threshold values (or ranges of threshold values) for each of the states 1480. These threshold values have been experimentally obtained using multiple batteries of the same type(s) as each battery 1035 in the user device 200. In one example, an absolute threshold value for the instantaneous battery thickness measurement 1481 might be a thickness measurement value associated with a battery that is exhibiting normal irreversible swelling. However, the value is large enough that it is on the cusp of a value associated with an abnormal thickness measurement (e.g., a thickness of a failing battery). When the value of the instantaneous battery thickness measurement 1481 meets or exceeds the absolute threshold value, the rules 1082 might specify that the signal processor 1110 create an alert message with "medium" severity and include the information that led to creation of the alert in the message. The BMS 1199 can receive the alert message, and in response, send a signal to the controller 1070 to charge the battery more slowly in an attempt to extend battery life.

In another example, when the instantaneous battery thickness measurement 1481 meets or exceeds a thickness measurement value associated with a battery that is exhibiting abnormal swelling, the signal processor 1110 might send a "high" severity message to the controller 1070 or the BMS 1199 to disable and/or cease charging the battery 1035 and notify the user to service the user device 200. Alternatively or additionally, in some embodiments, the system (e.g., via signal processor 1110) can send a signal to the user device 200 itself to notify the user (e.g., via a display of the user device, via a wired or wireless communication system of the user device, etc.) and/or to send a signal to a remote device or system (e.g., a network via which the user device communicates).

In another example, the set of messaging rules 1082 might include logic (e.g., business logic) that compares the instantaneous battery thickness measurement 1481 against relative threshold values of the same metric, for reference batteries of the same type as the test battery 1035. For example, the threshold values can be relative in that there are different thickness threshold values stored for different SOCs of the reference batteries, and/or different threshold values stored for different charge/discharge cycle numbers of the reference batteries. For this purpose, the signal processor 1110 might access the number of charge-discharge cycles of the test battery 1035, perform a lookup of this value (e.g., within the memory module 1080) for the reference batteries, and obtain threshold values (e.g., minimum and maximum expected instantaneous battery thickness measurements) for substantially the same number of charge-discharge cycles. The signal processor 1110 can then compare the actual thickness measurement 1481 to the reference threshold values.

It can also be appreciated that the functionality of the temperature sensor 1135 and/or the power sensor 1145 can be provided by an external BMS 1199 in communication with the user device 200, or an internal BMS 1199 incorporated into the user device 200 as shown in the figure. In some embodiments, because the system 1000 is included entirely within the user device 200, the processing and analysis of the response signals can therefore be performed entirely within the user device 200.

Ultrasound "Echo" Mode

Figure 2:
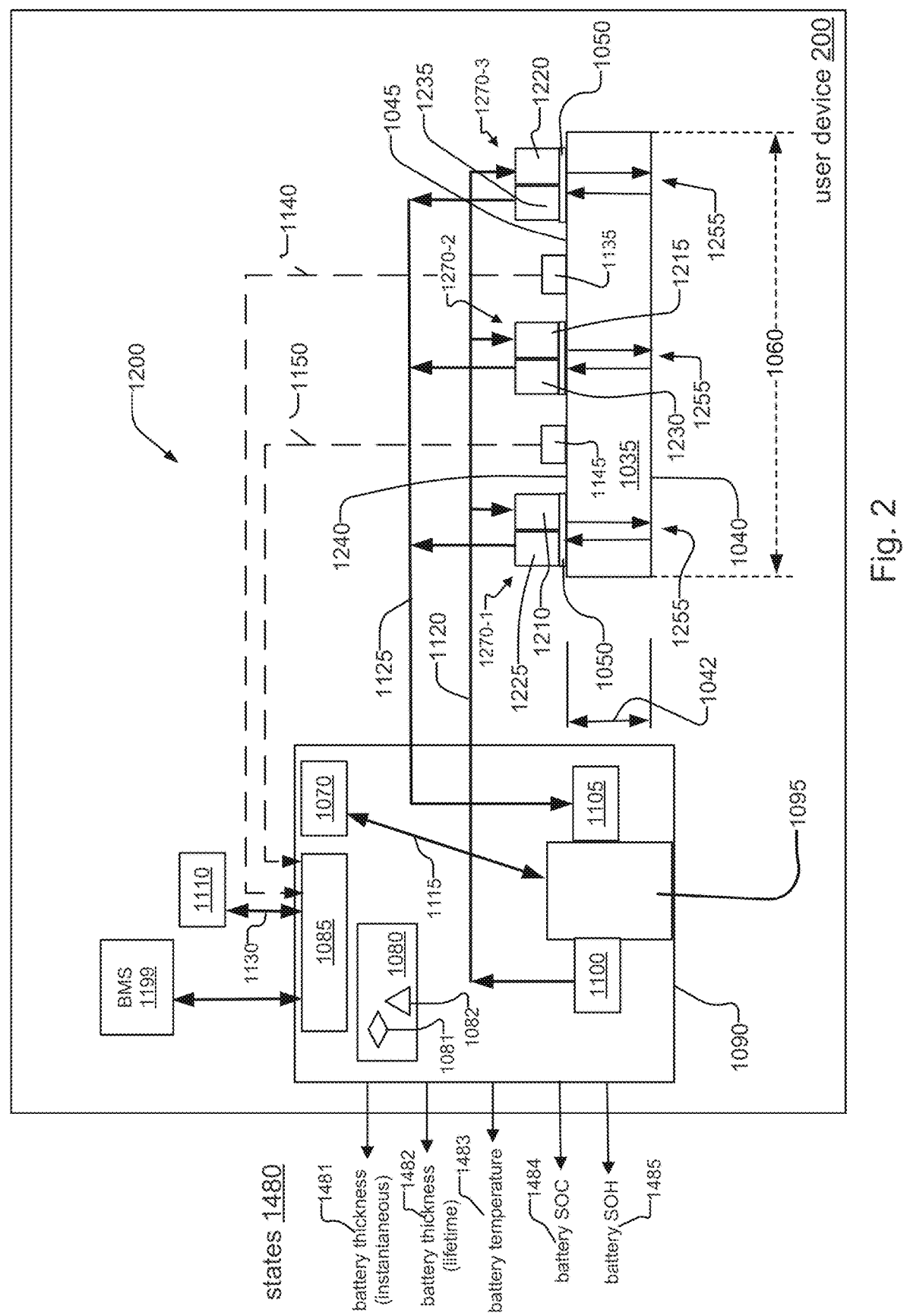
FIG. 2 is a schematic representation of a system similar to FIG. 1, according to one or more embodiments of the disclosed subject matter, where the system is configured instead to use MEMS ultrasound transducers operating in an echo mode.

FIG. 2 is a schematic representation of a battery monitoring system 1200 configured for ultrasound interrogation of a battery 1035 using an echo transmission method. The system 1200 includes substantially similar components as the system 1000 of FIG. 1, with some differences. As in the system 1000 of FIG. 1, the entirety of the system 1200 can be included within a user device 200.

In the illustrated example of FIG. 2, the system 1200 includes one or more MEMS ultrasound sources and one or more MEMS ultrasound sensors disposed against a same surface of the battery 1035. Three MEMS ultrasound sources 1210, 1215, 1220 and three MEMS ultrasound sensors 1225, 1230, 1235 are shown disposed against the second surface 1045 of the battery 1035. However, any number of MEMS ultrasound sources and MEMS ultrasound sensors is also possible according to one or more contemplated embodiments. The system 1200 also includes a signal processor 1110, an SDM 1090, a temperature sensor 1135 and a power sensor 1145 that are substantially similar to and operate in a substantially similar manner as the corresponding components in the system 1000 of FIG. 1.

Each MEMS ultrasound source 1210, 1215, 1220 is disposed to direct ultrasound generated thereby at the battery 1035, for example, at and through the second surface 1045 of the battery 1035. Each MEMS ultrasound sensor 1225, 1230, 1235 is disposed to sense ultrasound exiting from the battery 1035, for example, to sense an ultrasound echo exiting from inside the battery through the second surface 1045.

In some embodiments, the MEMS ultrasound sources and the MEMS ultrasound sensors are paired with each other, for example, with each ultrasound source being paired with one ultrasound sensor. Each paired MEMS ultrasound source and ultrasound sensor combination is positioned at a different location of the second surface 1045 to be interrogated. In some embodiments, the paired MEMS source and sensor are each acoustically coupled to the second surface of the battery by couplant material 1050. The couplant is disposed between the second surface of the battery and a surface of each ultrasound source and ultrasound sensor.

In some embodiments, for example, as shown in FIG. 2, each paired MEMS ultrasound source and MEMS ultrasound sensor are housed in a same MEMS transducer 1270. MEMS transducers 1270-1, 1270-2 and 1270-3 are shown and respectively include the following MEMS ultrasound source/MEMS ultrasound sensor pairs: 1210/1225, 1215/1230, and 1220/1235.

Alternatively, in some embodiments, each MEMS transducer 1270 is constructed to operate as both an ultrasound source and sensor. During operation of the system 1200, each transducer is alternately configured (e.g., by the controller 1070 and/or the excitation module 1100) to operate as an ultrasound source, and then configured (e.g., by the controller 1070 and/or the receiver module 1105) to operate as an ultrasound sensor.

In the illustrated example, each MEMS ultrasound source 1210, 1215, 1220 is paired with one MEMS ultrasound sensor 1225, 1230, 1235, e.g., shown schematically contacting each other. Each MEMS ultrasound source emits ultrasound into the battery 1035 in response to an electrical excitation signal received from the excitation module 1100 over the power channel 1120, as described herein above in relation to the ultrasound through-transmission mode. The emitted ultrasound is directed at the second surface 1045 of the battery 1035, passes through the couplant 1050 and the second surface 1045, and into the battery towards the first surface 1040. The emitted ultrasound is directed along a transmission axis 1255.

When the emitted ultrasound reaches the first surface 1040 of the battery 1035, the ultrasound is reflected/ "echoed" back from the first surface 1040, as ultrasound echo. The ultrasound echo is then directed back toward the second surface 1045 along the transmission axis 1255. The ultrasound echo then passes through the second surface 1045 and the couplant 1050 and is sensed by the ultrasound sensor paired with the ultrasound source. The ultrasound sensor, in response to sensing the ultrasound echo, generates a response signal, based thereon, and transmits the response signal to the signal receiver module 1105 over the signal channel 1125.

In some embodiments, the battery 1035 can be suited for ultrasound interrogation by the echo transmission method because the battery 1035 has opposing first and second surfaces that are parallel. However, embodiments of the disclosed subject matter are not limited thereto. Rather, the echo mode transmission mode and methods described herein can be used to interrogate any battery by receiving ultrasound echo from inside the battery according to one or more contemplated embodiments.

In some embodiments, the SDM 1090 can be configured to operate in a "round robin" fashion (e.g., as described above for system 1000 of FIG. 1) and stores the response signals from each of the MEMS ultrasound sensors to a buffer. After the SDM 1090 receives the response signals from all the MEMS ultrasound sensors, the SDM 1090 sends a "ready" signal to the signal processor 1110 to access the response signals in the buffer and analyze the response signals, for example, in conjunction with the temperature signal and the current and voltage signals. In some embodiments, because the system 1200 is included entirely within the user device 200, the processing and analysis of the response signals can therefore be performed entirely within the user device 200.

FIGS. 3-6 show more detail for echo mode systems similar to FIG. 2. In FIGS. 3-6, the battery 1035 is arranged such that its length 1060 is substantially vertical within the page, and the transmission axes 1055, 1255 (not shown) are substantially perpendicular to the page.

Figure 3:
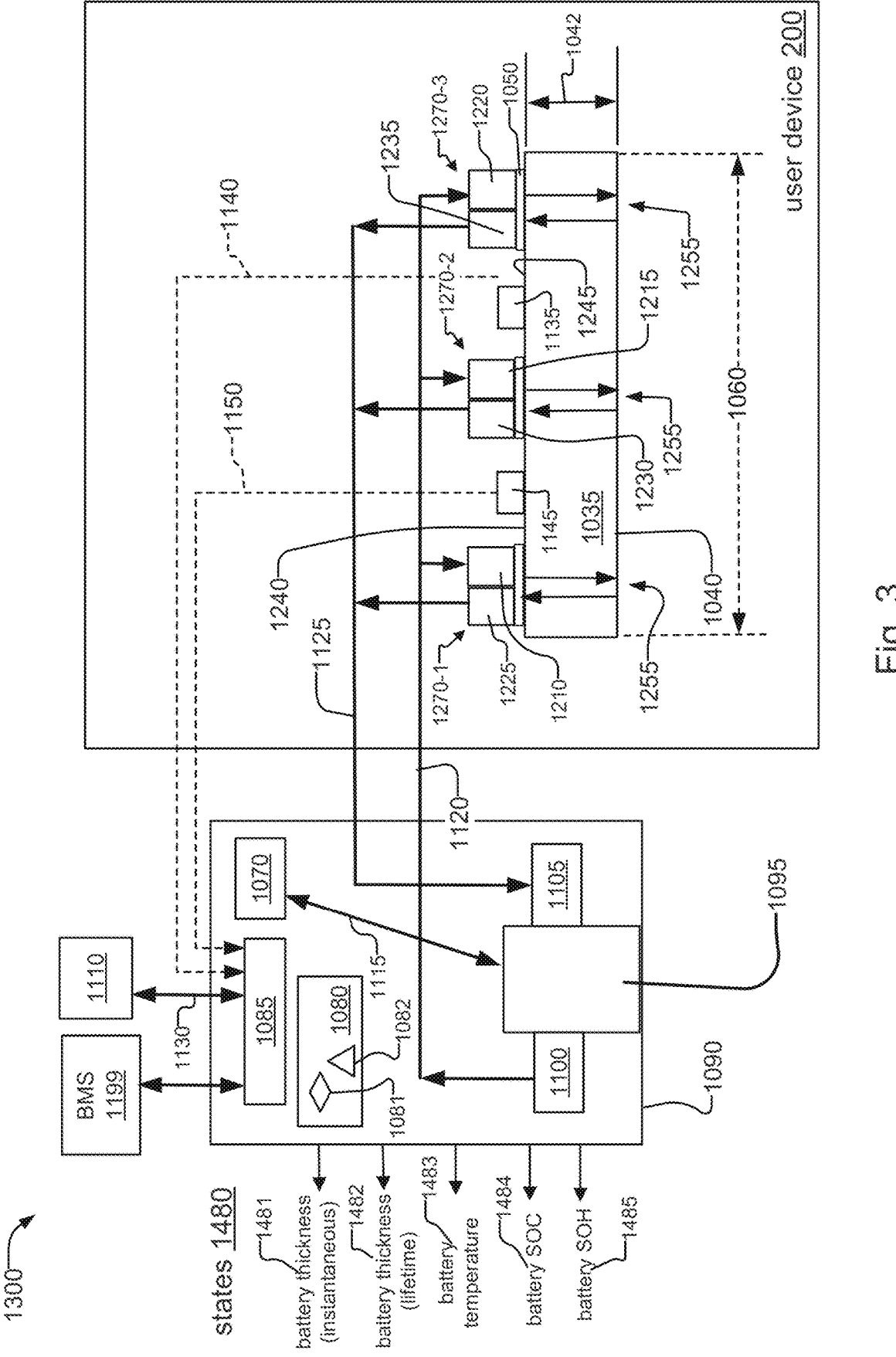
FIG. 3 is a schematic representation of a system similar to FIG. 2, according to one or more embodiments of the disclosed subject matter, where some components of the system are located outside the user device.

FIG. 3 is a schematic representation of yet another battery monitoring system 1300 constructed in accordance with principles of the present invention. In the illustrated example of FIG. 3, the system 1300 is configured as an echo mode system similar to FIG. 2, with the difference that the SDM 1090, the BMS 1199, and the signal processor 1110 are located outside of the user device 200.

Figure 4:
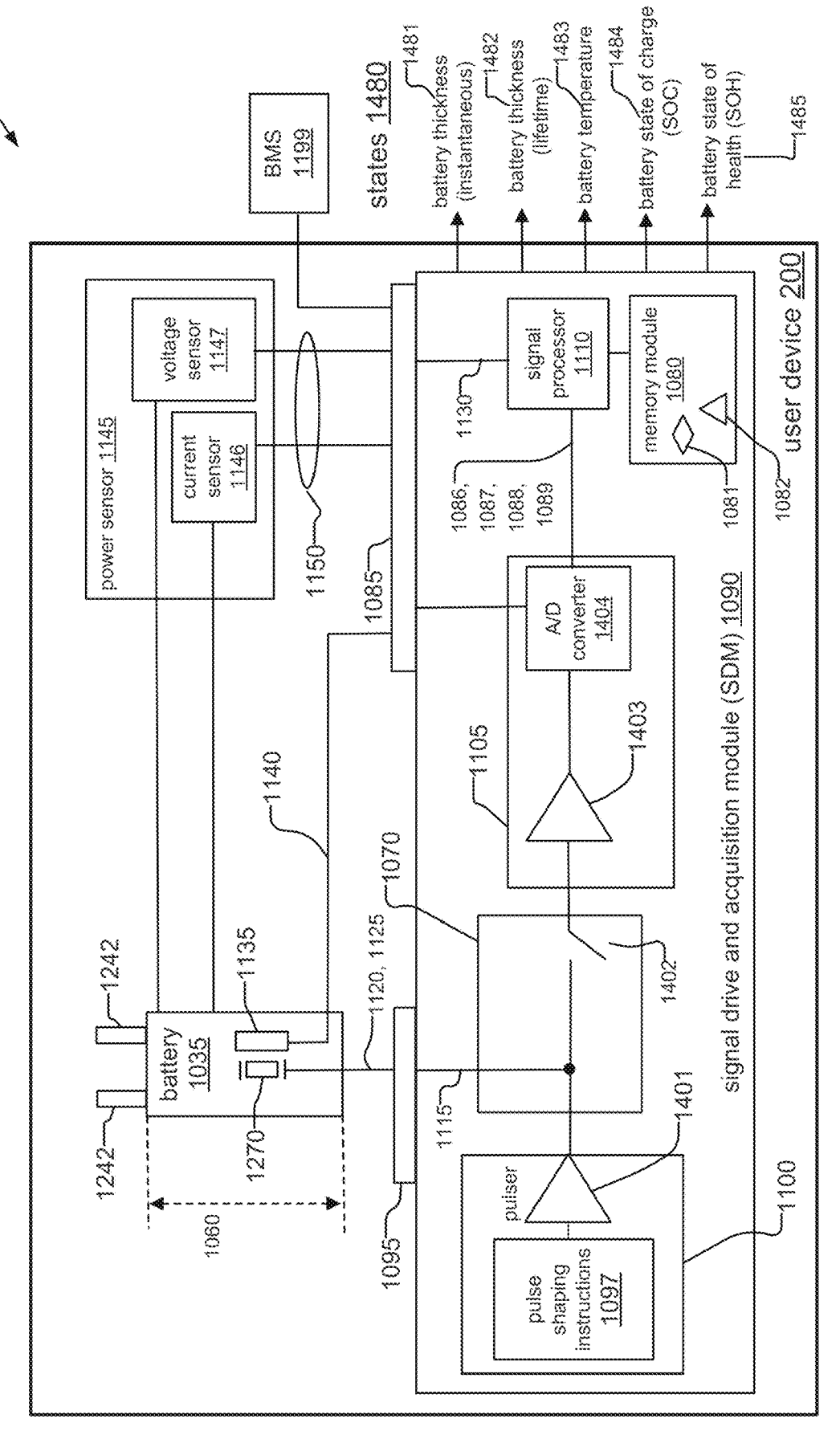
FIGS. 4, 5, and 6 are schematic diagrams that each show more detail for a system similar to FIG. 2, according to one or more embodiments of the disclosed subject matter, where the figures respectively show a single ultrasound transducer disposed against a single battery, multiple batteries with a single ultrasound transducer disposed against each battery, and a single battery with an array of ultrasound transducers disposed against the battery.

FIG. 4 shows another echo mode battery monitoring system 1400. The system 1400 is included within a user device 200 that is designed to interrogate a single battery 1035. For this purpose, the system 1400 includes a single MEMS transducer 1270. The MEMS transducer 1270 is disposed against a surface of the battery 1035. Terminals 1242 of the battery 1035 are also shown, which connect to a power bus (not shown) of the user device 200. Via its terminals 1242 and the power bus, the battery can provide power to various components of the user device 200, which discharges the battery 1035, and can receive power via the power bus to charge the battery 1035, in examples. As compared to the prior systems 1000, 1200 and 1300, the system 1400 shows more detail for components within the SDM 1090.

The system 1400 includes substantially similar components and can operate in a substantially similar manner as the systems 1000, 1200, and 1300. However, there are differences. The signal processor 1110 is included within the SDM 1090, the SDM 1090 is included within the user device 200, and the signal processor 1110 and the SDM 1090 are incorporated into or otherwise constructed in an integrated circuit form factor, such as an application specific integrated circuit (ASIC). The power sensor 1145 is connected to the battery 1035, rather than being a separate component disposed against the battery 1035. As in the system 1300, the BMS 1199 of system 1400 is external to the user device 200 and communicates with the system 1400 via the communications interface 1085.

An ASIC form factor for the SDM 1090 and signal processor 1110 has advantages. For example, the ASIC form factor has a low unit cost, is of minimal thickness such that it can be included within user devices 200 as small as mobile phones and possibly smaller, and its tight, small integrated package provides a short and efficient signal path.

In the illustrated example of FIG. 4, the excitation module 1100 includes pulse shaping instructions 1097 and a pulser 1401. The controller 1070 includes and controls a single transmit/receive switch ("T/R switch") 1402. The receiver module 1105 includes a linear amplifier 1403, and an analog to digital converter ("A/D converter") 1404.

The power sensor 1145 includes a separate current sensor 1146 and a voltage sensor 1147 that each connect to the battery 1035. The current sensor 1146 and voltage sensor 1147 are also connected to and are in communication with the communications interface 1085.

The components of the system 1400 can be arranged and configured to operate as follows. The T/R switch 1402 of the controller 1070 has the following communications path to the MEMS ultrasound transducer 1270: the T/R switch 1402 connects to the internal communications channel 1115, which in turn connects to signal channel 1225 via the controller interface 1095. The T/R switch 1402 is normally open, during which the pulser 1401 of the excitation module 1100 can send excitation signals via the controller interface 1095 over the power channel 1120 to the MEMS ultrasound transducer 1270.

When the MEMS ultrasound transducer 1270 sends its response signal back to the controller 1070, over the signal channel 1225 via the controller interface 1095, the controller 1070 closes the T/R switch 1402, and the response signal is sent to the receiver module 1105. At the receiver module 1105, the response signal is amplified by the linear amplifier 1403 and then converted to digital format by the A/D converter 1404 into a digitized response signal 1086.

At the same time, the temperature sensor 1135 periodically sends its temperature signal over the temperature signal channel 1140 to the communications interface 1085. The A/D converter 1404 receives the temperature signal via the communications interface 1085 and converts it into a digitized temperature signal 1087. Also, the current sensor 1146 and the voltage sensor 1147 of the power sensor 1145 periodically each send current and voltage measurements of the battery 1035 to the A/D converter 1404 via the communications interface 1085. The A/D converter 1404 converts these signals into a digitized current signal 1088 and a digitized voltage signal 1089, respectively, and sends these signals to the signal processor 1110. The digitized signals 1086, 1087, 1088, and 1089 are hereinafter recited without the word "digitized" in their names.

The signal processor 1110 connects to the A/D converter 1404, the memory module 1080 and the communications interface 1085. The signal processor 1110 accesses the signals 1086, 1087, 1088, 1089 buffered at the receiver module 1105. Using the set of feature rules 1081 in the memory module 1080, the signal processor 1110 analyzes the response signals 1086, possibly in conjunction with the temperature, current and voltage signals 1087, 1088, and 1089, to determine the different states 1480 of the battery 1035.

Catastrophic battery failure can occur in a matter of 10-15 minutes (or possibly even less) after abnormal swelling of the battery is detected. The system 1400 (and the other embodiments disclosed herein) can detect and report the level of swelling of the batteries installed in user devices 200 via the instantaneous thickness measurement 1481 and lifetime battery thickness measurement 1482, in examples.

In one implementation, the BMS 1199 can monitor these outputs/states 1480 and send alert messages when the signal processor 1110 determines that the thickness measurements 1481, 1482 meet or exceed one or more threshold values (e.g., stored in memory module 1080). The alert messages may be sent to a software application executing on the user device 200, or to another user device that is carried by or otherwise accessed by one or more individuals (e.g., an active user of the user device, potential user of the user device, manager for the user device, maintenance person for the user device, etc.). In this way, one or more individuals are alerted to potential problems with the user devices 200 before they occur, and catastrophic events such as abnormal swelling of the batteries 1035 can be avoided. Additionally and/or alternatively, the signal processor 1110 might also send the alert messages.

The ability of the system 1400 to predict and to detect early indicia of abnormal swelling of batteries 1035 in user devices 200 has additional advantages beyond user safety and possibly preventing damage to the user devices 200. Manufacturers of the user devices 200 can also save on repair costs and warranty claims, and also benefit from increased brand awareness that a user device 200 including the system 1400 can provide.

In some embodiments, the system 1400 can analyze the batteries 1035 periodically (e.g., once every minute), to determine the thickness measurements 1481, 1482 and the other states 1483-1485. The states 1480 can be timestamped and saved locally to the memory module 1080. Additionally or alternatively, the SDM 1090 may include the timestamped states 1480 obtained during each measurement and/or polling iteration in messages and can send the messages to an external data repository (not shown). At the data repository, the information in the messages can be stored to individual records for each battery 1035 of each user device 200.

Figure 5:
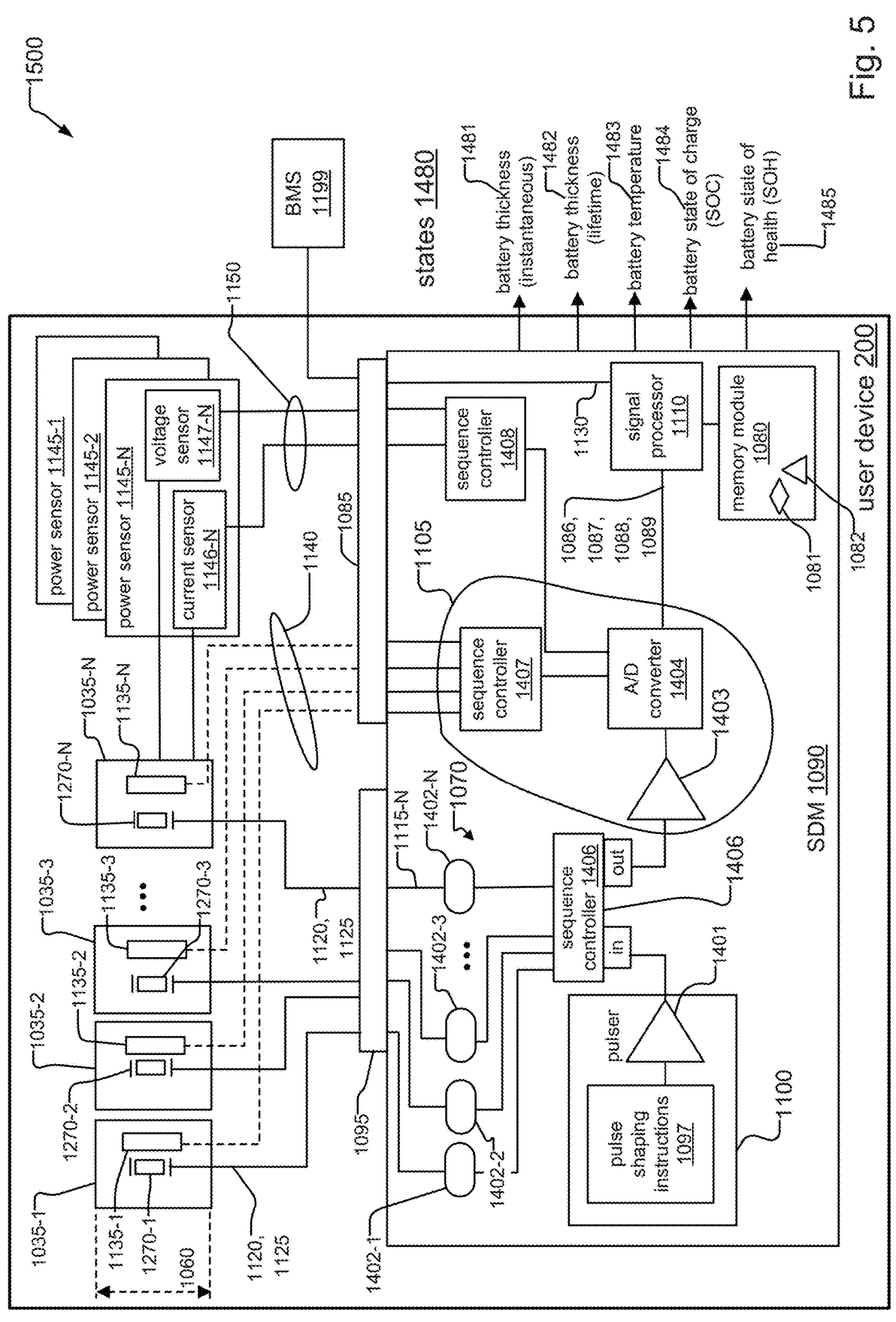

FIG. 5 shows yet another echo mode battery monitoring system 1500 included within a user device 200. The system 1500 is designed to interrogate multiple batteries 1035-1 . . . 1035-N within the same user device 200. For this purpose, the system 1500 includes multiple MEMS transducers 1270, where a separate MEMS ultrasound transducer is disposed against a surface of each battery 1035. A separate temperature sensor 1135 is also provided, for example, disposed against a surface of each of the batteries 1035. In addition, the system 1500 includes multiple power sensors 1145, where a separate current sensor 1146 and voltage sensor 1147 within each power sensor 1145 are connected to terminals of each battery 1035 to measure current and voltage of each battery 1035, respectively. Due to limited space in the figure, terminals of the batteries 1035 are not shown, and only connections from power sensor 1145-N to its associated battery 1035-N are shown. As in the systems

1300 and 1400, the BMS 1199 of the system 1500 is external to the user device 200 and communicates with the system 1500 via the communications interface 1085.

The system 1500 includes additional components. The controller 1070 includes multiple T/R switches 1402-1 . . . 1402-N, where N is the number of batteries 1035 to interrogate and includes a first sequence controller 1406 for selecting a MEMS transducer 1270 associated with each individual battery 1035. The receiver module 1105 includes a second sequence controller 1407 that is configured to select a temperature measurement from an individual battery of the N batteries 1035. The SDM 1090 also includes a third sequence controller 1408 that selects one power sensor 1145 from a plurality of power sensors.

It can also be appreciated that the capabilities of the power sensors 1145 might be provided by an internal or external BMS 1199 that is connected to each of the N batteries, rather than a separate physical power sensor 1145-1 . . . 1145-N as shown.

In the illustrated example of FIG. 5, the controller 1070 uses the first sequence controller 1406 to select one T/R switch 1402 at a time, from among an N number of T/R switches. Each T/R switch 1401-1, 1402-2, . . . 1402-N is connected to a corresponding MEMS transducer 1270-1, 1270-2, . . . 1270-N disposed against each battery 1035-1, 1035-2 . . . 1035-N. Via the first sequence controller 1406, the controller 1070 can select and operate the T/R switch 1402 for each MEMS transducer 1270 to either send an excitation signal to the MEMS transducer or receive the response signal 1086 from the MEMS transducer.

In a similar vein, the receiver module 1105 uses the second sequence controller 1407 to select the temperature measurement obtained by and sent from the temperature sensors 1135-1 . . . 1135-N associated with each of the batteries 1035-1 . . . 1035-N. The receiver module 1105 also uses the third sequence controller 1408 to select the current and voltage measurement provided by the power sensor 1145-1 . . . 1145-N for each battery (or separate BMS connection for each battery). For this purpose, a power sensor 1145-N includes an associated instance of a current sensor 1146-N and an associated instance of a voltage sensor 1147-N, each of the instances connected to a battery 1035-N.

A unique number (e.g., transducer number) is assigned to each of the MEMS ultrasound transducers 1270, and the memory module 1080 includes a map that relates the number of each MEMS transducer to its battery 1035. Using the map, the controller 1070 and/or the SDM 1090 can route signals and/or messages between components. The excitation signals and the response signals 1086 can also include the transducer number in metadata, in one example, to identify the associated MEMS transducer 1270. The signal processor 1110 and/or the controller 1070, in turn, can access the map to identify the associated MEMS transducer 1270 and battery 1035 for each excitation signal and response signal 1086.

Then, for each battery 1035-1 . . . 1035-N, the signal processor 1110 accesses the response signal 1086, the temperature signal 1087, the current signal 1088, and the voltage signal 1089 buffered at the receiver module 1105. Using the set of feature rules 1081 in the memory 1080, the signal processor 1110 analyzes the signals 1086-1089 associated with each of the batteries to determine the different states 1480 of each battery 1035-1 . . . 1035-N.

Figure 6:
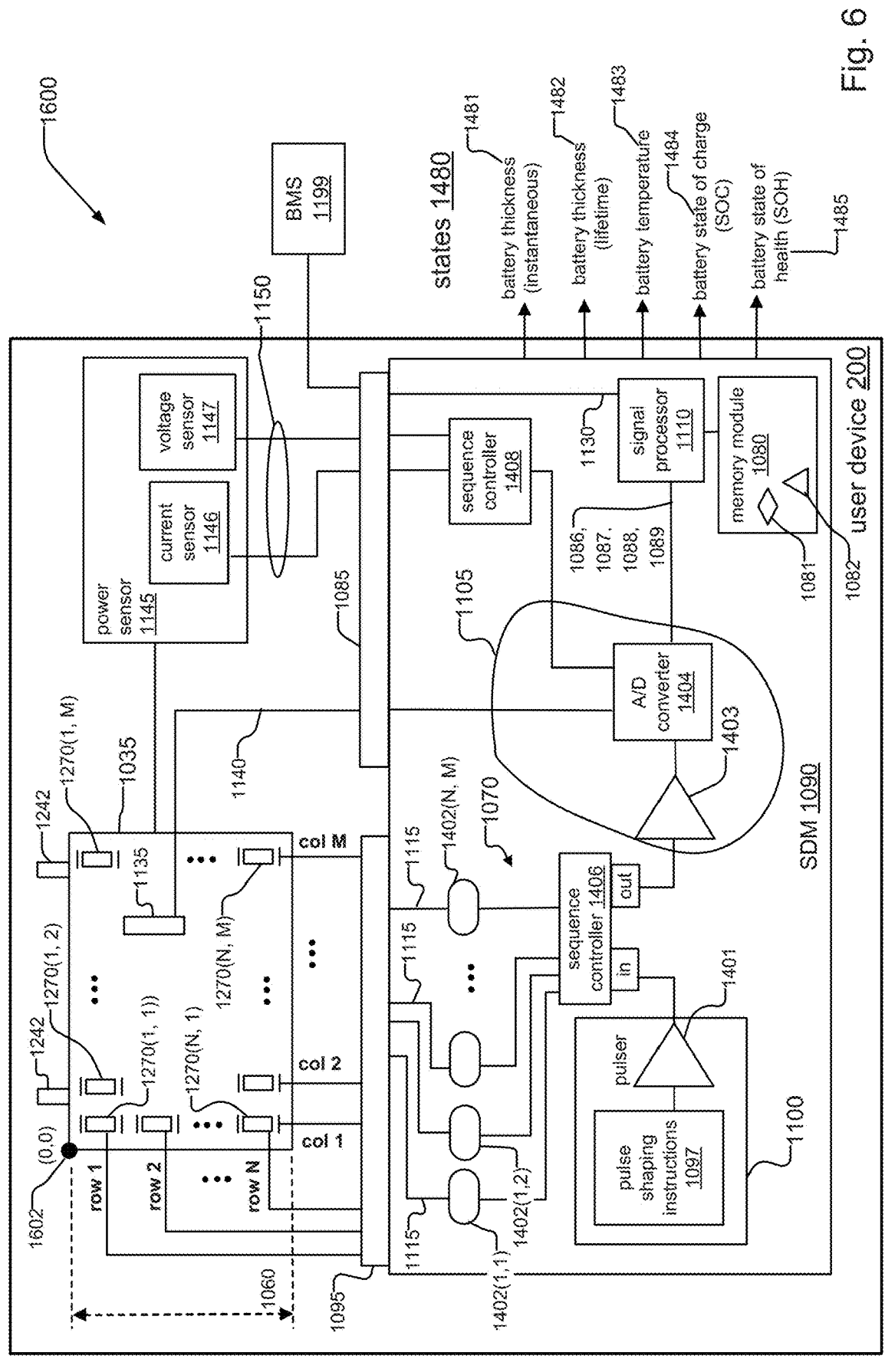

FIG. 6 shows still another echo mode system 1600 included within a user device 200. In the system 1600, multiple MEMS transducers 1270 are each disposed upon a surface of a single battery 1035 at different locations of the surface. The MEMS transducers 1270 are arranged in N rows and M columns, abbreviated in the figure as "row" and "col," such that each individual transducer is indicated by 1270 (N, M). For this purpose, in one example, the N×M transducers 1270 might be spaced substantially equidistant/regularly spaced apart from one another upon a battery surface 1040, 1045, and somewhat away from edges of the surfaces 1040, 1045. In another example, for a same number of N×M transducers 1270, the transducers 1270 might be spaced more sparsely apart on a surface 1040, 1045 and extend up to the edges of the surfaces 1040, 1045.

A single temperature sensor 1335 is also disposed against a surface of the battery 1035, and a single instance of the power sensor 1145 measures current and voltage from the battery 1035. As in the systems 1300, 1400, and 1500, the BMS 1199 of the system 1600 is external to the user device 200 and communicates with the system 1600 via the communications interface 1085.

As in the system 1500 of FIG. 5, the controller 1070 of the system 1600 includes multiple T/R switches 1402 and a first sequence controller 1406. Because a separate T/R switch is associated with a specific MEMS ultrasound transducer, the individual T/R switches 1402 are indicated by 1402 (N, M). In the illustrated example of FIG. 6, the controller 1070 configures the T/R switches 1402 (N, M) and the first sequence controller 1406 to send and receive information from each of the MEMS transducers 1270 (N, M).

In some embodiments, a unique number (e.g., transducer number) is assigned to each of the MEMS transducers 1270, and an x-y coordinate system with an origin 1602 is also assigned to each surface 1040, 1045 upon which the MEMS transducers are disposed. Alternatively or additionally, in some embodiments, a row-column address is used. The memory module 1080 can include a map that relates the number of each MEMS transducer 1270 to its battery location, relative to the origin 1602. In this way, the excitation signals and the response signals can include the transducer number to identify the MEMS transducer 1270. The controller 1070, other components of the SDM 1090 and/or the signal processor 1110 can then access the map to identify the associated MEMS transducer/battery location for each excitation signal and response signal 1086.

In the illustrated example of FIG. 6, the controller 1070 uses the first sequence controller 1406 to select one T/R switch 1402 from a plurality of N T/R switches. Each T/R switch 1401-, 1402-2, . . . 1402-N is connected to an individual corresponding MEMS transducer 1270-1, 1270-2 . . . 1270-N disposed against a surface of the battery 1035. Via the first sequence controller 1406, the controller 1070 can select and operate the T/R switch 1402 for each MEMS transducer 1270 to either send an excitation signal to the MEMS transducer 1270 or receive the response signal 1086 from the MEMS transducer 1270.

Then, the signal processor 1110 accesses the signals 1086-1089 buffered at the receiver module 1105. Using the set of feature rules 1081 in the memory 1080, the signal processor 1110 analyze the response signals 1086 to determine the different states 1480 of the battery 1035. As noted herein above with respect to the systems 1000, 1200, 1300, 1400 and 1500, the signal processor 1110 of the system 1600 might also analyze the response signals 1086 in conjunction with the temperature, current and voltage signals 1087, 1088 and 1089 to determine the different states 1480 of the battery 1035.

The memory module 1080 can also include one or more machine learning models that the signal processor 1110 can access and load. The models might be pre-trained or not. In one example, the signal processor 1110 might determine an initial set of states 1480, and then pass the initial set of states as input to the one or more machine learning models, the result of which are predicted versions of the states 1480. Over time, multiple sets of output states 1480 can then be fed back as input to the model(s) to produce additional predicted output states.

While FIGS. 4-6 show more detail for the echo mode systems 1400, 1500 and 1600, it can also be appreciated that the aspects of these systems are also applicable to the through-transmission mode system 1000 of FIG. 1. For this purpose, one or more MEMS ultrasound source/sensor pairs might be disposed against opposing sides 1040, 1045 of each of the batteries 1035, where applicable. Correspondingly, an appropriate number and configuration of T/R switches 1402 can connect each of the MEMS ultrasound source/sensor pairs to the controller 1070. In this way, the controller 1070 can instruct the excitation module 1100 to send the excitation signals to the MEMS ultrasound source of each source/sensor pair and can instruct the receiver module 1105 to receive the response signals 1086 from the MEMS ultrasound sensor of each source/sensor pair. In a similar vein, an appropriate number and configuration of sequence controllers 1406-1408 can connect temperature sensors 1135 and power sensors 1145 to each of the batteries 1035 and enable the signal processor 1110 to receive the response signals 1086, temperature signals 1087, current signals 1088 and voltage signals 1089.

In some embodiments, for example, as shown in FIG. 6, the MEMS ultrasound sources and sensors can be arranged in an array format, and a single array can be disposed against one side of each battery 1035. For this purpose, the array may include multiple MEMS ultrasound transducers 1270, each of which can be configured as a MEMS ultrasound source or sensor (e.g., by controller 1070) at different times, for example, based upon testing objectives. Alternatively or additionally, in some embodiments, two arrays of MEMS transducers are disposed against each battery 1035, where a first array is placed on a first side of each battery and a second array is placed on a second side of each battery 1035 that opposes the first side. Additionally or alternatively, multiple individual MEMS transducers that can be configured either as MEMS ultrasound sources or sensors can be disposed against one or more sides of each battery 1035 in accordance with echo mode and/or through-transmission mode configuration of system 1600. It can also be appreciated that each of systems 1000, 1200, 1300, 1400, 1500, and 1600 can be configured to send multiple excitation pulses to each MEMS ultrasound source and/o MEMS transducer 1270 per test run, and to execute multiple test runs. For example, in some embodiments, a set of excitation pulses that includes as many as 16 excitation pulses in a sequence can be sent to each MEMS ultrasound sensor and/or MEMS transducer 1270 per test run. For example, the signal processor 1110 waits to receive all response signals 1086 for an associated MEMS ultrasound sensor and/or MEMS transducer 1270 before sending the set of excitation pulses to the next MEMS ultrasound source and/or MEMS transducer 1270, if applicable.

Within each test run, the excitation pulses within the set of excitation pulses can be the same or different. The excitation pulses can differ in one or more of frequency/wavelength, amplitude, phase, pulse width, cycle count, pulse repetition frequency, and waveform type, in examples. The waveform types can include square wave (unipolar or bipolar) and sinusoid, in examples. For example, the waveform of each excitation pulse can be programmed such that the wavelength of the ultrasound wave emitted from the MEMS ultrasound source and/or MEMS ultrasound transducer 1270 is less than the battery thickness dimension 1042.

Devices for Ultrasound Monitoring

Figure 7:
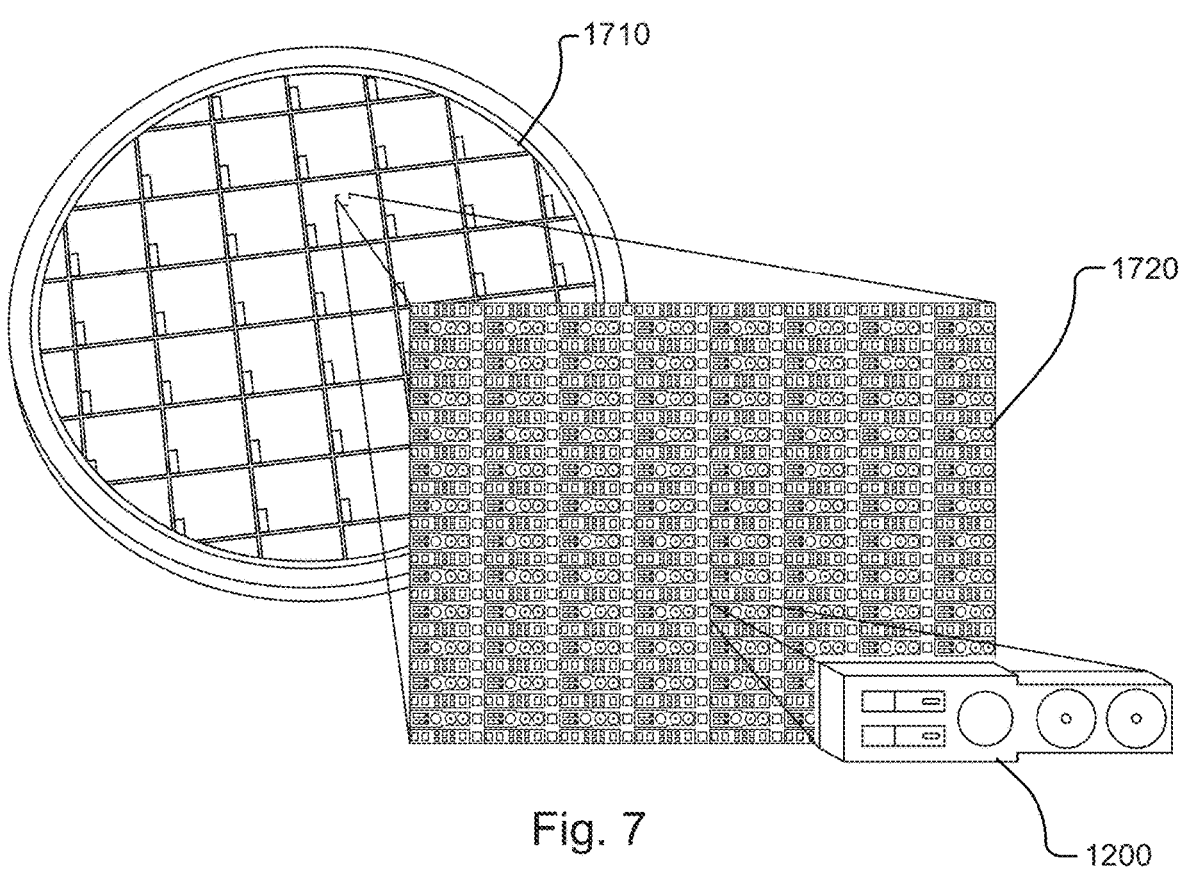
FIG. 7 is an image of a semiconductor wafer that includes thousands of separate "chips," each of which incorporates nearly all components of the system in FIG. 4, in one example.

FIG. 7 is an image of a semiconductor wafer 1710 that includes thousands of separate "chips" in an array 1720. Each chip on the wafer is an ASIC and is typically designed and fabricated to have identical structures and functionality. Each chip includes nearly all components of one of the battery monitoring systems 1000, 1200, 1300, 1400, 1500 and 1600. Typically, a separate wafer 1710 is designed and fabricated for each of the systems.

In one implementation, each chip on a wafer 1710 incorporates nearly all components of the echo mode system 1400 in FIG. 4, with the exception of the external BMS 1199 and the power sensor 1145. For example, each chip/system 1400 is designed for use and inclusion within a separate user device 200. In some embodiments, the chip is glued or otherwise bonded to a surface of the single battery 1035 during the manufacturing and assembly phase of the user device 200, such that the MEMS transducer 1270 and the temperature sensor 1135 of the chip/device 1400 are placed against the battery surface. In some embodiments, the glue or bonding agent can also function as a couplant 1050. Alternatively, in some embodiments, a separate couplant can be provided in addition to the glue or bonding agent.

In some embodiments, the MEMS transducer is a CMUT device, for example, of about 0.6 mm in thickness. Alternatively, in some embodiments, the MEMS transducer 1270 is a CMUT device having a thickness less than or equal to 0.4 mm.

A power sensor 1145 is then connected to the interface 1085 of the SDM 1090 and to the battery 1035. The chip might also be connected to the battery terminals 1242 so that the chip, and thus the system 1400 formed by the chip, is powered and operates only when the battery 1035 is charging. Alternatively, even the power sensor 1145 might be included in the chip.

In some embodiments, each chip includes at least the signal processor 1110 and the SDM 1090 for one of the systems 1000, 1200, 1300, 1400, 1500 or 1600, but does not include the MEMS transducers 1270. During manufacturing/assembly of the user device 200, micro-sized CMUT or PMUT devices as the MEMS transducers 1270 can be bonded to one or more surfaces 1040, 1045 of each of the batteries 1035 in the user device 200. A single chip including at least the signal processor 1110 and the SDM 1090 is included within the user device 200, and wires connect each of the MEMS transducers 1270 to the SDM 1090 and/or to the signal processor 1110, in accordance with the connections described herein above for each of the systems 1000, 1200, 1300, 1400, 1500 or 1600. Power to the chip, connections to the power sensor 1145 and other interfacing is then provided as described above for the "system on a chip"/chip that forms system 1400.

Figure 8:
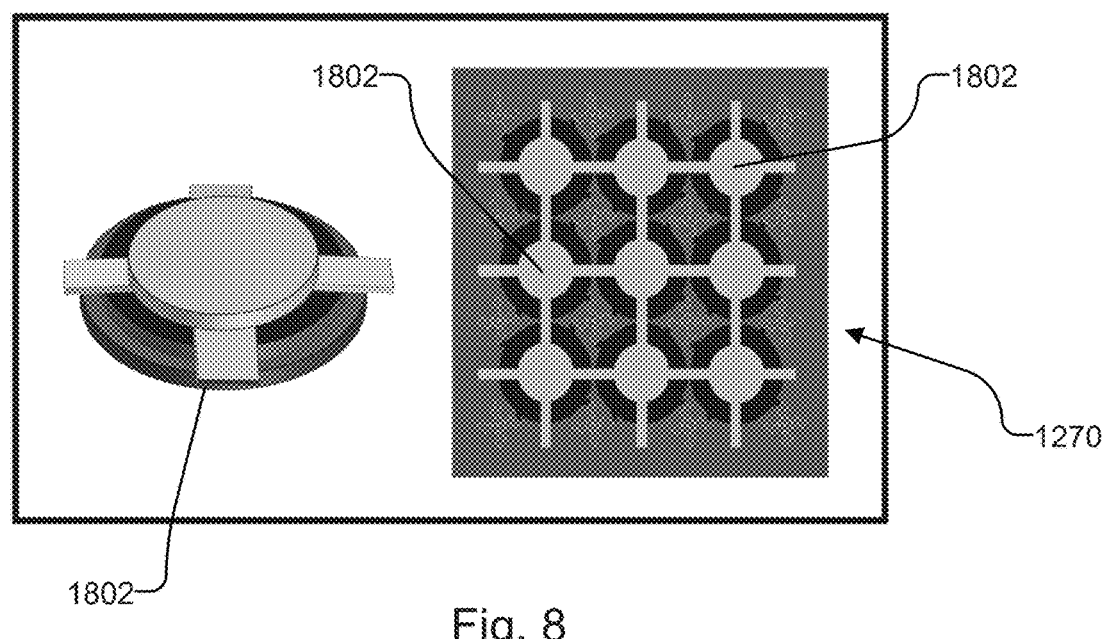
FIG. 8 is an image that shows an individual element of a MEMS transducer in a left portion of the image, and an exemplary grouping of individual MEMS transducer elements connected in a grid-like fashion in a right portion of the image.

FIG. 8 is an image that shows an individual element 1802 of a MEMS transducer 1270 in a left portion of the image, and an exemplary grouping of nine individual MEMS transducer elements 1802 connected in a grid-like fashion in a right portion of the image. In some embodiments, the interconnected MEMS transducer elements can operate collectively to provide the functionality of a MEMS transducer 1270. MEMS transducers elements operating as a single transducer can have advantages over standard, unitary piezoelectric transducers. For example, the ultrasound waves emitted by the MEMS transducers have fewer sidelobes when the systems of FIGS. 1-6 are configured to have explicit control of each of the sub-elements 1802 that comprise the MEMS transducer 1270. Alternatively or additionally, the MEMS transducers can have an improved response, for example, because the individual elements 1802 contribute much smaller unwanted vibrations than that of a single conventional ultrasound transducer. Additionally, MEMS transducers can have low unit cost, have sub-millimeter thickness that enables the transducers to fit within the smallest of user devices 200, and can have high bandwidth.

Figures 9, 10:
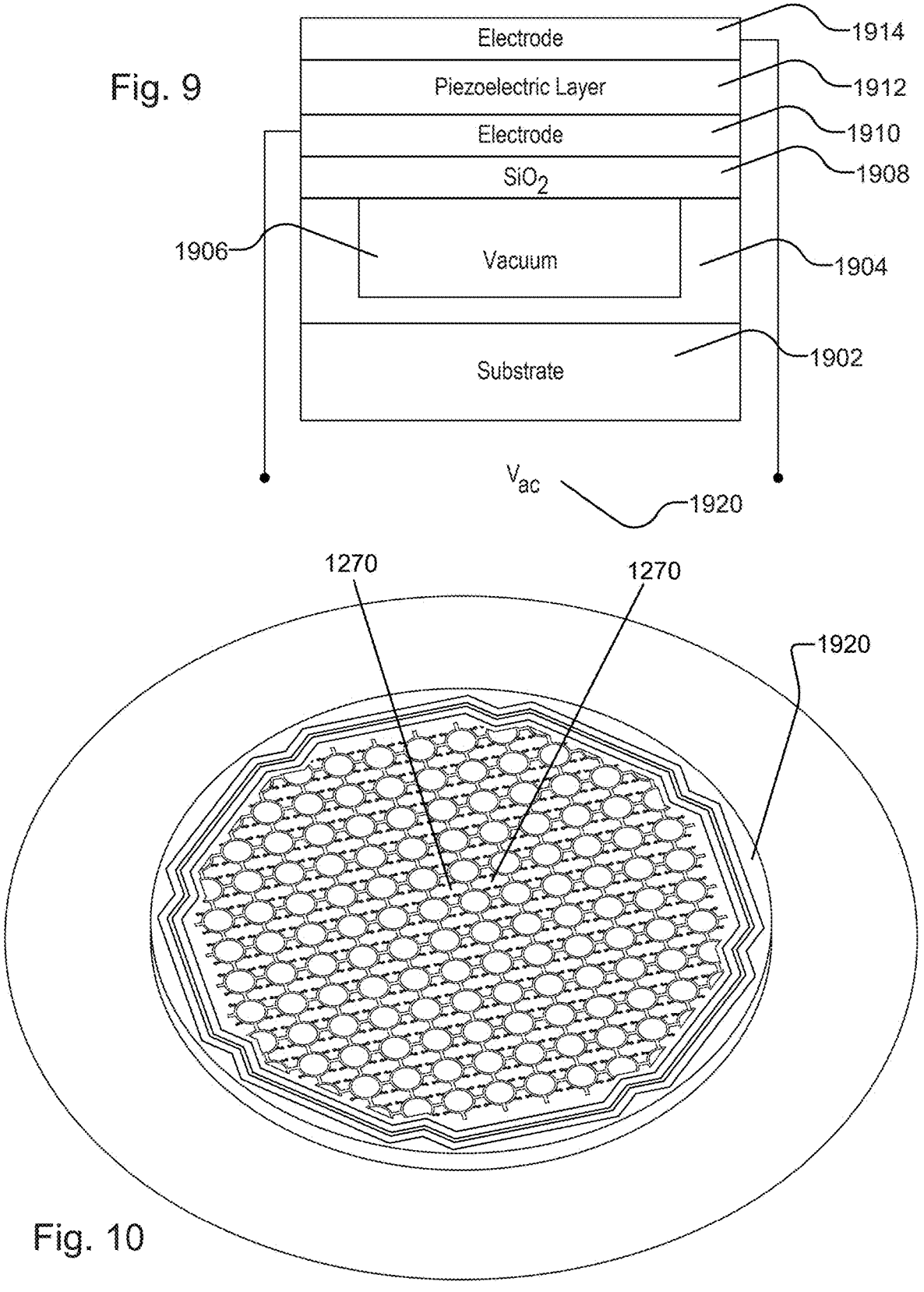
FIG. 9 is a schematic diagram showing an arrangement of semiconductor layers of a piezoelectric micro-machined ultrasound transducer (PMUT) MEMS transducer.
FIG. 10 is an image of a semiconductor wafer that includes more than one hundred capacitive micro-machined ultrasound transducer (CMUT) transducers.

FIG. 10 is an image of a semiconductor wafer that includes more than one hundred CMUT devices 1270. The devices 1270 may be cut from the wafer individually or in groups and bonded to surfaces 1040, 1045 of batteries 1035 in the user devices 200. The devices 1270 can include any number of individual "drums"/elements 1802 connected together to form the CMUT devices 1270.

In some embodiments, in place of or in addition to CMUT elements, PMUT MEMS transducers can be used. FIG. 9 is a schematic diagram showing arrangement of semiconductor layers of a PMUT MEMS transducer. The PMUT is constructed as a number of successively stacked layers upon a non-conductive substrate 1902. The substrate 1902 is mounted upon a surface of a battery 1035 or other test object, with a couplant 1050 (not shown) disposed between the substrate and the surface of the battery 1035.

More detail for an example arrangement of the layers within the PMUT is as follows. A bottom non-conductive layer with a vacuum well 1906 is fabricated on top of the substrate 1902. A silicon dioxide insulator layer 1908 is fabricated on top of the vacuum well 1906 and bottom layer 1904. A first metal electrode layer 1910 is then fabricated on top of the insulator layer 1908. A piezoelectric layer 1912 is then fabricated on top of the first electrode layer 1910, followed by a second electrode layer 1914 on top of the piezoelectric layer 1912. In this way, the piezoelectric layer 1912 is sandwiched between the first electrode layer 1910 on the bottom and a second electrode layer 1914 on the top.

In some embodiments, the PMUT can operate as follows. When the PMUT operates as an ultrasound source, an AC voltage 1920 in the form of an excitation signal is applied across the first and second electrode layers 1910, 1914. The excitation signal causes the transducer to vibrate, the result of which emits an ultrasound wave downward, through the couplant 1050 and into the battery 1035. When the PMUT operates as an ultrasound sensor, an AC voltage 1920 that represents vibration sensed by the PMUT is measured across the first and second electrode layers 1910, 1914.

System Operation

In some embodiments, the system of any of FIGS. 1-6 can operate only when the batteries 1035 are charging. This has advantages, including preserving battery life by not draining the batteries, and because charging of batteries 1035 is a higher risk mode for battery failure then when discharging. In some embodiments, via the SOC state 1484 and SOH state 1485, any of the battery monitoring systems 1000, 1200, 1300, 1400, 1500 and 1600 can estimate capacity changes to the batteries 1035 and possibly adjust charging parameters to prolong battery life. If the system determines indicia of abnormal swelling via the instantaneous thickness measurement state 1481 and/or lifetime thickness measurement state 1482, the system can be configured to send one or more shutdown signals to an internal or external BMS 1199 (e.g., to shut down charging of the batteries 1035) and/or to send notification messages to individual(s) (e.g., user of the user device). Alternatively or additionally, the battery temperature state 1483 can be used to gauge possible battery failure, and an internal or external BMS 1199 might shut down charging of the batteries 1035 and/or send notification messages to individual(s).

As noted hereinabove in the descriptions of FIGS. 1-6, the signal processor 1110 might analyze the timestamped response signal 1086 in conjunction with the timestamped temperature, current and voltage signals 1087, 1088, and 1089, respectively, to determine the states 1480 of the battery 1035.

Additionally or alternatively, in some embodiments, a system (e.g., any of FIGS. 1-6) can operate upon stacks of batteries 1035. For example, as few as two or three thin "pouch" style batteries can be glued together to form a stack, which the systems 1000, 1200, 1300, 1400, 1500 and 1600 can operate upon to determine various states of the battery stack.

In some embodiments, a system (e.g., any of FIGS. 1-6) can be included and/or configured to operate within devices other than user devices. For example, these devices can include consumer devices including electronic toys, consumer televisions, cable set-top boxes and modems, internet access points, communications equipment, military devices and systems, battery packs such as electric vehicle (EV) packs, and battery storage systems.

In some embodiments, a system (e.g., any of FIGS. 1-6) can be configured to adjust charging parameters of the batteries 1035 in response to the set of outputs 1480 produced by the respective system. For example, if the battery temperature 1483 exceeds a first threshold value and/or the instantaneous battery thickness 1481 has exceeded a second threshold value, the system (e.g., via signal processor 1110) can send a message via the communications interface 1085 to an internal or external BMS 1199 to charge the batteries more slowly in an effort to prolong battery life. In some embodiments, the second threshold value might be a typical thickness measurement for a battery of a same type and approximately a same number of charge/discharge cycles as the battery under test.

In some embodiments, the states 1480 can be determined when the battery 1035 is fully discharged or when fully charged. Alternatively or additionally, the states 1480 can be determined (or at least data to determine states 1480 acquired) while the battery 1035 is discharging or charging. In some embodiments, it may be helpful to determine the instantaneous thickness measurement 1481 and the lifetime thickness 1482 states when the battery is charging, since most battery failures occur during charging and abnormal swelling leading to catastrophic battery failure and/or fire can occur in a matter of minutes (e.g., ≤10-15 minutes).

Ultrasound Monitoring Methods

FIG. 11 is a flowchart that describes a method of operation of a battery monitoring system according to one or more embodiments of the disclosed subject matter. In some embodiments, the method of FIG. 11 can describe operation of any of the battery monitoring systems 1000, 1100, 1200, 1300, 1400, 1500, and 1600.

The method can begin at process block 902, where a MEMS ultrasound source and a MEMS ultrasound sensor can be disposed against a battery included in a user device. At process block 904, an excitation module can transmit an excitation signal to the MEMS ultrasound source. The MEMS ultrasound source can receive the excitation signal and can transmit an ultrasound pulse into the battery in response to receiving the excitation signal.

At process block 906, the system can detect (e.g., via a MEMS ultrasound sensor) the ultrasound pulse from the battery, and a response signal associated with the detected ultrasound can be generated (e.g., by the MEMS ultrasound sensor). At process block 908, the system can receive (e.g., via the receiver module 1105) the response signal (e.g., from the MEMS ultrasound sensor). Then, at process block 910, the response signal can be analyzed (e.g., via signal processor 1110), and the different states of the battery can be determined (e.g., by the signal processor 1110) in response to the analysis.

Although some of blocks 902-910 of the method of FIG. 11 have been described as being performed once, in some embodiments, multiple repetitions of a particular process block may be employed before proceeding to the next decision block or process block. In addition, although blocks 902-910 of the method of FIG. 11 have been separately illustrated and described, in some embodiments, process blocks may be combined and performed together (simultaneously or sequentially). Moreover, although FIG. 11 illustrates a particular order for blocks 902-910, embodiments of the disclosed subject matter are not limited thereto. Indeed, in certain embodiments, the blocks may occur in a different order than illustrated or simultaneously with other blocks. In some embodiments, a method can include steps or other aspects not specifically illustrated in FIG. 11. Alternatively or additionally, in some embodiments, the method may comprise only some of blocks 902-910 of FIG. 11.

Computer Implementation

Figure 12:
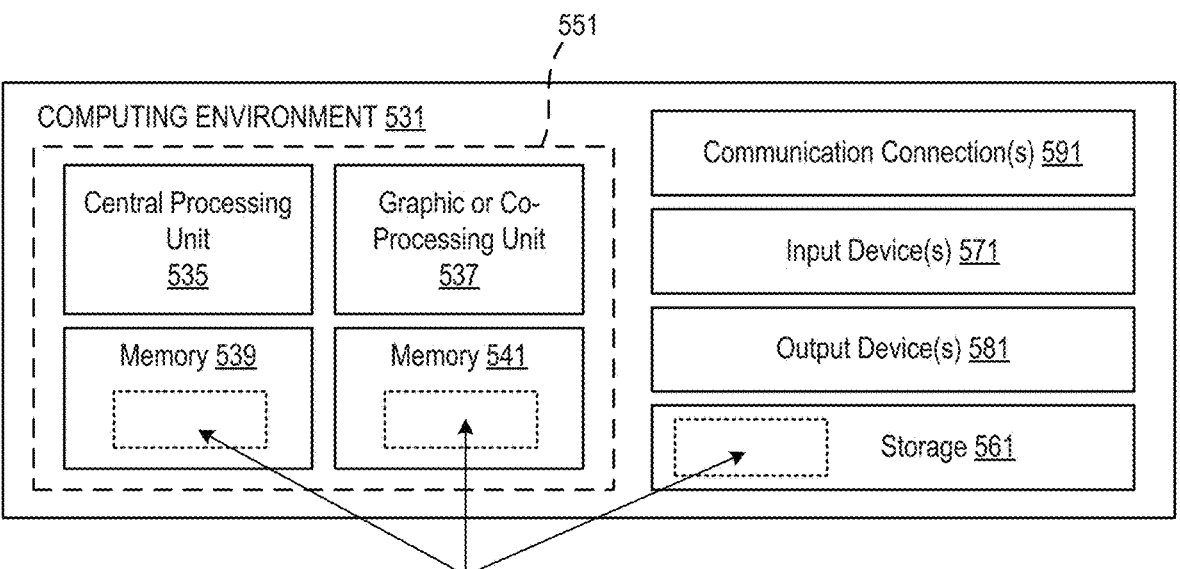
FIG. 12 is a block diagram of a computing environment in which the described innovations may be implemented.

FIG. 12 depicts a generalized example of a suitable computing environment 531 in which the described innovations may be implemented, such as but not limited to BMS 1199, SDM 1090, and/or the method of FIG. 11. The computing environment 531 is not intended to suggest any limitation as to scope of use or functionality, as the innovations may be implemented in diverse general-purpose or special-purpose computing systems. For example, the computing environment 531 can be any of a variety of computing devices (e.g., desktop computer, laptop computer, server computer, tablet computer, etc.).

With reference to FIG. 12, the computing environment 531 includes one or more processing units 535, 537 and memory 539, 541. This basic configuration 551 is included within a dashed line. The processing units 535, 537 execute computer-executable instructions. A processing unit can be a central processing unit (CPU), a processor in an application-specific integrated circuit (ASIC), a microcontroller, or any other type of processor (e.g., hardware processors, graphics processing units (GPUs), virtual processors, etc.). In a multi-processing system, multiple processing units execute computer-executable instructions to increase processing power. For example, FIG. 12 shows a central processing unit 535 as well as a graphics processing unit or co-processing unit 537. The tangible memory 539, 541 may be volatile memory (e.g., registers, cache, RAM), non-volatile memory (e.g., ROM, EEPROM, flash memory, etc.), or some combination of the two, accessible by the processing unit(s). The memory 539, 541 stores software 533 implementing one or more innovations described herein, in the form of computer-executable instructions suitable for execution by the processing unit(s).

A computing system may have additional features. For example, the computing environment 531 includes storage 561, one or more input devices 571, one or more output devices 581, and one or more communication connections 591. An interconnection mechanism (not shown) such as a bus, controller, or network interconnects the components of the computing environment 531. Typically, operating system software (not shown) provides an operating environment for software executing in the computing environment 531 such as the software 533, and coordinates activities of the components of the computing environment 531.

The tangible storage 561 may be removable or non-removable, and includes magnetic disks, magnetic tapes or cassettes, CD-ROMs, DVDs, or any other medium which can be used to store information in a non-transitory way, and which can be accessed within the computing environment 531. The storage 561 can store instructions for the software 533 implementing one or more innovations described herein.

The input device(s) 571 may be a touch input device such as a keyboard, mouse, pen, or trackball, a voice input device, a scanning device, or another device that provides input to the computing environment 531. The output device(s) 581 may be a display, printer, speaker, CD-writer, or another device that provides output from computing environment 531.

The communication connection(s) 591 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, radio-frequency (RF), or another carrier.

Any of the disclosed modes or methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or any other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C++, Java™, Python®, and/or any other suitable computer language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. In any of the above-described examples and embodiments, provision of a request (e.g., data request), indication (e.g., data signal), instruction (e.g., control signal), or any other communication between systems, components, devices, etc. can be by generation and transmission of an appropriate electrical signal by wired or wireless connections.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable medium may cause a programmable processor, or other processor, to perform the method, e.g., when the instructions are executed. Computer-readable media may include non-transitory computer-readable storage media and transient communication media. Computer readable storage media, which is tangible and non-transitory, may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer-readable storage media. It should be understood that the term "computer-readable storage media" refers to physical storage media, and not signals, carrier waves, or other transient media.

Additional Examples of the Disclosed Technology

In view of the above-described implementations of the disclosed subject matter, this application discloses the additional examples in the clauses enumerated below. It should be noted that one feature of a clause in isolation, or more than one feature of the clause taken in combination, and, optionally, in combination with one or more features of one or more further clauses are further examples also falling within the disclosure of this application.

Clause 1. A system comprising:

a microelectromechanical system (MEMS) ultrasound source within a user device and disposed with respect to a battery of the user device, the MEMS ultrasound source being configured to generate an ultrasound pulse;

a MEMS ultrasound sensor within the user device and disposed with respect to the battery of the user device, the MEMS ultrasound sensor being configured to detect ultrasound from the battery and to generate a response signal based on the detected ultrasound; and a control system operatively coupled to the MEMS ultrasound source and the MEMS ultrasound sensor, the control system being configured to:

send an excitation signal to the MEMS ultrasound source, such that the MEMS ultrasound source transmits the ultrasound pulse into the battery responsive to receiving the excitation signal;

receive the response signal from the MEMS ultrasound sensor; and analyze the response signal so as to determine at least two different states of the battery.

Clause 2. The system of any clause or example herein, in particular, Clause 1, wherein the control system comprises:

a signal drive and acquisition module (SDM) including a controller, a memory, an excitation module and a receiver module, wherein the excitation module is configured by the controller to transmit the excitation signal to the MEMS ultrasound source, the MEMS ultrasound source is configured to transmit an ultrasound pulse into the battery in response to receiving the excitation signal, and the MEMS ultrasound sensor is configured by the controller to detect the ultrasound pulse from the battery and to generate the response signal associated with the detected ultrasound that is received by the receiver module; and a processor that is configured to access the receiver module, analyze the response signal, and determine the different states of the battery in response to the analysis.

Clause 3. The system of any clause or example herein, in particular, Clause 2, wherein the SDM and the processor are included within the user device.

Clause 4. The system of any clause or example herein, in particular, any one of Clauses 2-3, wherein the SDM and the processor are part of a common integrated circuit.

Clause 5. The system of any clause or example herein, in particular, any one of Clauses 1-4, wherein the control system is formed as part of or contained within the user device.

Clause 6. The system of any clause or example herein, in particular, any one of Clauses 1-4, wherein the control system is formed as part of or coupled to the battery.

Clause 7. The system of any clause or example herein, in particular, any one of Clauses 1-6, wherein the user device is a laptop computer, a tablet computer, a smart phone, or a mobile phone.

Clause 8. The system of any clause or example herein, in particular, any one of Clauses 1-7, wherein the MEMS ultrasound source and the MEMS ultrasound sensor are disposed against a same surface of the battery, and wherein the MEMS ultrasound sensor detects ultrasound pulses reflected from an interior of the battery.

Clause 9. The system of any clause or example herein, in particular, Clause 1-7, wherein the MEMS ultrasound source is disposed against a first surface of the battery and the MEMS ultrasound sensor is disposed against a second surface of the battery that opposes the first surface, and wherein the MEMS ultrasound sensor detects ultrasound transmitted through the battery.

Clause 10. The system of any clause or example herein, in particular, Clause 1-9, wherein at least one of the MEMS ultrasound source and the MEMS ultrasound sensor comprises a capacitive micromachined ultrasonic transducer (CMUT).

Clause 11. The system of any clause or example herein, in particular, Clause 1-10, wherein at least one of the MEMS ultrasound source and the MEMS ultrasound sensor comprises a piezoelectric micromachined ultrasonic transducer (PMUT).

Clause 12. The system of any clause or example herein, in particular, any one of Clauses 1-11, wherein the at least two different states includes a state of charge (SOC) of the battery, a state of health (SOH) of the battery, a temperature of the battery, or any combination of the foregoing.

Clause 13. The system of any clause or example herein, in particular, any one of Clauses 1-12, wherein the at least two different states includes (a) an instantaneous thickness measurement of the battery and/or (b) a lifetime thickness measurement of the battery, determined from one or more instantaneous thickness measurements of the battery obtained over time.

Clause 14. The system of any clause or example herein, in particular, any one of Clauses 1-13, wherein the control system is configured to send the excitation signal and/or receive the response signal only when the battery is fully discharged or when the battery is fully charged.

Clause 15. The system of any clause or example herein, in particular, any one of Clauses 1-14, wherein the control system is configured to send the excitation signal and/or receive the response signal while the battery is actively charging or discharging.

Clause 16. The system of any clause or example herein, in particular, any one of Clauses 1-15, wherein the control system comprises one or more non-transitory computer-readable storage media storing computer-readable instructions for a set of feature rules that define one or more features to extract from the response signal during the analysis of the response signal.

Clause 17. The system of any clause or example herein, in particular, any one of Clauses 1-16, wherein the MEMS source and the MEMS sensor are part of a common MEMS transducer.

Clause 18. The system of any clause or example herein, in particular, any one of Clauses 1-17, wherein the MEMS source and/or the MEMS sensor are disposed on a respective surface portion of the battery via a respective ultrasound couplant or respective portion of a common ultrasound couplant.

Clause 19. The system of any clause or example herein, in particular, any one of Clauses 1-18, wherein the MEMS source and/or the MEMS sensor are coupled to a respective surface portion of the battery by a glue or bonding agent.

Clause 20. The system of any clause or example herein, in particular, Clause 19, wherein the glue or bonding agent acts as an ultrasound couplant.

Clause 21. A method comprising:
transmitting, via a MEMS ultrasound source, an ultrasound pulse into a battery of a user device;
detecting, via MEMS ultrasound sensor, ultrasound from the battery in response to the transmitted ultrasound pulse; and
determining at least two different states of the battery based at least in part on the detected ultrasound, wherein the MEMS ultrasound source and the MEMS ultrasound sensor are disposed within the user device.

Clause 22. The method of any clause or example herein, in particular, Clause 21, further comprising disposing the MEMS ultrasound source and the MEMS ultrasound sensor with respect to the battery within the user device.

Clause 23. The method of any clause or example herein, in particular, any one of Clauses 21-22, wherein the transmitting comprises transmitting an excitation signal to the MEMS ultrasound source, the MEMS ultrasound source transmitting the ultrasound pulse into the battery in response to receiving the excitation signal.

Clause 24. The method of any clause or example herein, in particular, any one of Clauses 21-23, wherein the detecting comprises generating, by the MEMS ultrasound sensor, a response signal associated with the detected ultrasound.

Clause 25. The method of any clause or example herein, in particular, Clause 24, wherein the determining comprises:
receiving the response signal from the MEMS ultrasound sensor; and
analyzing the response signal so as to determine the different states of the battery.

Clause 26. The method of any clause or example herein, in particular, any one of Clauses 21-25, wherein the determining is performed by a control system operatively coupled to the MEMS ultrasound source and the MEMS ultrasound sensor, the control system being disposed within the user device.

Clause 27. The method of any clause or example herein, in particular, any one of Clauses 21-26, further comprising, prior to the transmitting, disposing the MEMS ultrasound source and the MEMS ultrasound sensor against a same surface of the battery, the MEMS ultrasound sensor detecting ultrasound pulses reflected from an interior of the battery.

Clause 28. The method of any clause or example herein, in particular, any one of Clauses 21-26, further comprising, prior to the transmitting, disposing the MEMS ultrasound source against a first surface of the battery and disposing the MEMS ultrasound sensor against a second surface of the battery that opposes the first surface, the MEMS ultrasound sensor detecting ultrasound transmitted through the battery.

Clause 29. The method of any clause or example herein, in particular, any one of Clauses 21-28, wherein at least one of the MEMS ultrasound source and the MEMS ultrasound sensor comprises a capacitive micromachined ultrasonic transducer (CMUT).

Clause 30. The method of any clause or example herein, in particular, any one of Clauses 21-29, wherein at least one of the MEMS ultrasound source and the MEMS ultrasound sensor comprises a piezoelectric micromachined ultrasonic transducer (PMUT).

Clause 31. The method of any clause or example herein, in particular, any one of Clauses 21-30, wherein the determining is performed by a processor included within the user device.

Clause 32. The method of any clause or example herein, in particular, any one of Clauses 21-31, wherein the at least two different states includes a state of charge (SOC) of the battery, a state of health (SOH) of the battery, a temperature of the battery, or any combination of the foregoing.

Clause 33. The method of any clause or example herein, in particular, any one of Clauses 21-32, wherein the at least two different states includes (a) an instantaneous thickness measurement of the battery and/or (b) a lifetime thickness measurement of the battery, determined from one or more instantaneous thickness measurements of the battery obtained over time.

Clause 34. The method of any clause or example herein, in particular, any one of Clauses 21-33, wherein the ultrasound pulse is transmitted and/or the ultrasound from the battery is detected only when the battery is fully discharged and/or when the battery is fully charged.

Clause 35. The method of any clause or example herein, in particular, any one of Clauses 21-34, wherein the ultrasound pulse is transmitted and/or the ultrasound from the battery is detected while the battery is actively charging and/or discharging.

Clause 36. The method of any clause or example herein, in particular, any one of Clauses 21-35, comprising disposing the MEMS ultrasound source and/or the MEMS ultrasound sensor on a respective surface portion of the battery via a respective ultrasound couplant or respective portion of a common ultrasound couplant.

Clause 37. The method of any clause or example herein, in particular, any one of Clauses 21-36, comprising coupling the MEMS ultrasound source and/or the MEMS ultrasound sensor on a respective surface portion of the battery by a glue or bonding agent.

Clause 38. The method of any clause or example herein, in particular, Clause 37, wherein the glue or bonding agent acts as an ultrasound couplant.

Clause 39. A method for operating a system of any clause or example herein, in particular, any one of Clauses 1-20 and/or any of FIGS. 1-12.

CONCLUSION

Although batteries, components, and configuration have been illustrated in the figures and discussed in detail herein, embodiments of the disclosed subject matter are not limited thereto. Indeed, one of ordinary skill in the art will readily appreciate that different batteries, components, or configurations can be selected and/or components added to provide the same effect. In practical implementations, embodiments may include additional components or other variations beyond those illustrated. Accordingly, embodiments of the disclosed subject matter are not limited to the particular batteries, components, and configurations specifically illustrated and described herein.

Any of the features illustrated or described herein, for example, with respect to FIGS. 1-12 and Clauses 1-39, can be combined with any other feature illustrated or described herein, for example, with respect to FIGS. 1-12 and Clauses 1-39 to provide systems, devices, methods, and embodiments not otherwise illustrated or specifically described herein. All features described herein are independent of one another and, except where structurally impossible, can be used in combination with any other feature described herein.

In view of the many possible embodiments to which the principles of the disclosed technology may be applied, it should be recognized that the illustrated embodiments are only examples and should not be taken as limiting the scope of the disclosed technology. Rather, the scope is defined by the following claims. We therefore claim all that comes within the scope and spirit of these claims.

The invention claimed is:

1. A system for monitoring a battery within a user device, the system comprising:
   a micro-electro-mechanical system (MEMS) ultrasound source and a MEMS ultrasound sensor that are each included within the user device and are disposed against the battery; and
   one or more computing units comprising a battery management system, a signal drive and acquisition module (SDM), and a processor,
   wherein the SDM includes a controller, a memory, an excitation module, and a receiver module,
      wherein the excitation module is configured by the controller to transmit an excitation signal to the MEMS ultrasound source, the MEMS ultrasound source is configured to transmit an ultrasound pulse into the battery in response to receiving the excitation signal, and the MEMS ultrasound sensor is configured by the controller to detect the ultrasound pulse from the battery and to generate a response signal associated with the detected ultrasound that is received by the receiver module;
   wherein the processor is configured to access the receiver module, analyze the response signal, and determine different states of the battery in response to the analysis, the determined states including an instantaneous thickness measurement of the battery, and
   wherein the one or more computing units are configured to:
      compare the determined instantaneous thickness measurement to one or more predetermined thresholds; and
      adjust operation of the battery responsive to the comparison.

2. The system of claim 1, wherein the MEMS ultrasound source and the MEMS ultrasound sensor are disposed against a same surface of the battery, and the MEMS ultrasound sensor detects ultrasound pulses reflected from an interior of the battery.

3. The system of claim 1, wherein:
   the MEMS ultrasound source is disposed against a first surface of the battery;
   the MEMS ultrasound sensor is disposed against a second surface of the battery that opposes the first surface; and the MEMS ultrasound sensor detects ultrasound transmitted through the battery.

4. The system of claim 1, wherein the MEMS ultrasound source and the MEMS ultrasound sensor are capacitive micromachined ultrasonic transducers (CMUT) or piezoelectric micromachined ultrasonic transducers (PMUT).

5. The system of claim 1, wherein each of the one or more computing units is included within the user device.

6. The system of claim 1, wherein the SDM and the processor are incorporated into a same integrated circuit.

7. The system of claim 1, wherein the determined states further include a state of charge (SOC), a state of health (SOH), and a temperature of the battery.

8. The system of claim 1, wherein the memory includes a set of feature rules that define one or more features for the processor to extract from the response signal during the analysis of the response signal.

9. The system of claim 1, wherein the one or more predetermined thresholds comprise a first threshold corresponding to normal irreversible swelling of the battery, and adjusting operation of the battery comprises adjusting charging parameters so as to extend a life of the battery.

10. The system of claim 1, wherein the one or more predetermined thresholds comprise a second threshold corresponding to abnormal irreversible swelling of the battery, and adjusting operation of the battery comprises disabling the battery or ceasing charging of the battery.

11. The system of claim 1, wherein the one or more predetermined thresholds comprise a plurality of stored thresholds, each stored threshold corresponding to a different state of charge or different charge/discharge cycle number of a reference battery, and the one or more computing units are further configured to select one of the plurality of stored thresholds for the comparing based on a state of charge or charge/discharge cycle number for the battery in the user device.

12. A method for monitoring a battery within a user device using a micro-electro-mechanical system (MEMS) ultrasound source and MEMS ultrasound sensor disposed against the battery and within the user device, the method comprising:
   transmitting an excitation signal to the MEMS ultrasound source such that the MEMS ultrasound source transmits an ultrasound pulse into the battery in response to the excitation signal;
   detecting the ultrasound pulse from the battery via the MEMS ultrasound sensor and generating a response signal associated with the detected ultrasound;
   analyzing the response signal and determining different states of the battery in response to the analyzing, the determined states including an instantaneous thickness measurement of the battery;
   comparing the determined instantaneous thickness measurement to one or more predetermined thresholds; and
   adjusting operation of the battery responsive to the comparing.

13. The method of claim 12, wherein:
   the MEMS ultrasound source and the MEMS ultrasound sensor are disposed against a same surface of the battery, and
   the MEMS ultrasound sensor detects ultrasound pulses reflected from an interior of the battery.

14. The method of claim 12, wherein:
   the MEMS ultrasound source is disposed against a first surface of the battery,
   the MEMS ultrasound sensor is disposed against a second surface of the battery that opposes the first surface, and the MEMS ultrasound sensor detects ultrasound transmitted through the battery.

15. The method of claim 12, wherein the MEMS ultrasound source and the MEMS ultrasound sensor are capacitive micromachined ultrasonic transducers (CMUT) or piezoelectric micromachined ultrasonic transducers (PMUT).

16. The method of claim 12, wherein at least the analyzing the response signal is performed by a processor included within the user device.

17. The method of claim 12, wherein the determined states further include a state of charge (SOC), a state of health (SOH), and a temperature of the battery.

18. The method of claim 12, wherein the determined states further include:

a lifetime thickness measurement of the battery, determined from one or more instantaneous thickness measurements of the battery obtained over time.

19. The method of claim 12, wherein the one or more predetermined thresholds comprise a first threshold corresponding to a normal irreversible swelling of the battery, and the adjusting operation of the battery comprises adjusting charging parameters so as to extend a life of the battery.

20. The method of claim 12, wherein the one or more predetermined thresholds comprise a second threshold corresponding to abnormal irreversible swelling of the battery, and the adjusting operation of the battery comprises disabling the battery or ceasing charging of the battery.

21. The method of claim 12, wherein:

the one or more predetermined thresholds comprise a plurality of stored thresholds, each stored threshold corresponding to a different state of charge or different charge/discharge cycle number of a reference battery, and the method further comprises selecting one of the plurality of stored thresholds for the comparing based on a state of charge or charge/discharge cycle number for the battery in the user device.

22. The method of claim 12, wherein:

the ultrasound pulse transmitted into the battery has a wavelength less than a thickness of the battery; or a near field boundary separating a Fresnel region and a Fraunhofer region of the transmitted ultrasound pulse occurs within the battery.

\* \* \* \* \*